US011448222B2

(12) United States Patent
Tsai et al.

(10) Patent No.: US 11,448,222 B2
(45) Date of Patent: Sep. 20, 2022

(54) LIQUID COOLING MULTI-PUMPING UNIT

(71) Applicant: COOLER MASTER CO., LTD., New Taipei (TW)

(72) Inventors: Shui-Fa Tsai, New Taipei (TW); Ting-Chun Huang, New Taipei (TW)

(73) Assignee: COOLER MASTER CO., LTD., New Taipei (TW)

( * ) Notice: Subject to any disclaimer, the term of this patent is extended or adjusted under 35 U.S.C. 154(b) by 0 days.

(21) Appl. No.: 16/943,602

(22) Filed: Jul. 30, 2020

(65) Prior Publication Data
US 2022/0039290 A1 Feb. 3, 2022

(51) Int. Cl.
*H05K 7/20* (2006.01)
*F04D 13/14* (2006.01)
*F04D 29/42* (2006.01)
*F04D 13/06* (2006.01)
*F04D 29/62* (2006.01)
*F04D 13/12* (2006.01)

(52) U.S. Cl.
CPC ............. *F04D 13/14* (2013.01); *F04D 13/06* (2013.01); *F04D 13/12* (2013.01); *F04D 29/4293* (2013.01); *F04D 29/628* (2013.01); *H05K 7/20272* (2013.01)

(58) Field of Classification Search
CPC .......... F04D 13/14; F04D 1/06; F04D 29/426; F04D 13/06; F04D 13/12; H05K 7/20272
See application file for complete search history.

(56) References Cited

U.S. PATENT DOCUMENTS

| 4,738,584 A * | 4/1988 | Price | B01F 7/00733 |
| | | | 415/203 |
| 9,677,820 B2 * | 6/2017 | Tsai | F28F 13/06 |
| 10,198,046 B2 * | 2/2019 | Tsai | H05K 7/20272 |
| 10,932,391 B2 * | 2/2021 | Tsai | H05K 7/20272 |
| 2013/0213605 A1 * | 8/2013 | Shi | H05K 7/20218 |
| | | | 165/96 |
| 2017/0009773 A1 * | 1/2017 | Marenco | F04D 1/06 |
| 2018/0094633 A1 * | 4/2018 | Huang | F04D 13/0693 |
| 2019/0120249 A1 * | 4/2019 | Judge | H02K 7/14 |
| 2019/0121406 A1 * | 4/2019 | Tsai | H05K 7/20272 |
| 2019/0187763 A1 * | 6/2019 | Chen | F04D 15/0066 |

FOREIGN PATENT DOCUMENTS

| TW | 201727081 A | 8/2017 |
| TW | 201933036 A | 8/2019 |

* cited by examiner

*Primary Examiner* — Dominick L Plakkoottam
(74) *Attorney, Agent, or Firm* — Dickinson Wright PLLC

(57) ABSTRACT

A liquid cooling multi-pumping unit comprising a main body and first and second pumps arranged in series is provided. During operation, cooling fluid is sucked via a cooling fluid inlet into a first fluid chamber and then into a first central chamber opening to a plurality of curved blades of a first impeller assembled in a first pump chamber. From there, the cooling fluid travels and is sucked through a fluid distribution channel into a second fluid chamber and then into a second central chamber opening to a plurality of curved blades of a second impeller assembled in a second pump chamber, before exiting through a fluid outlet. The series arrangement of the first and second pumps increases head pressure, and provides sufficient liquid flak in the case where one liquid cooling pump fails. Additionally, lower energy consumption is achieved die to the lower operating speeds required.

24 Claims, 19 Drawing Sheets

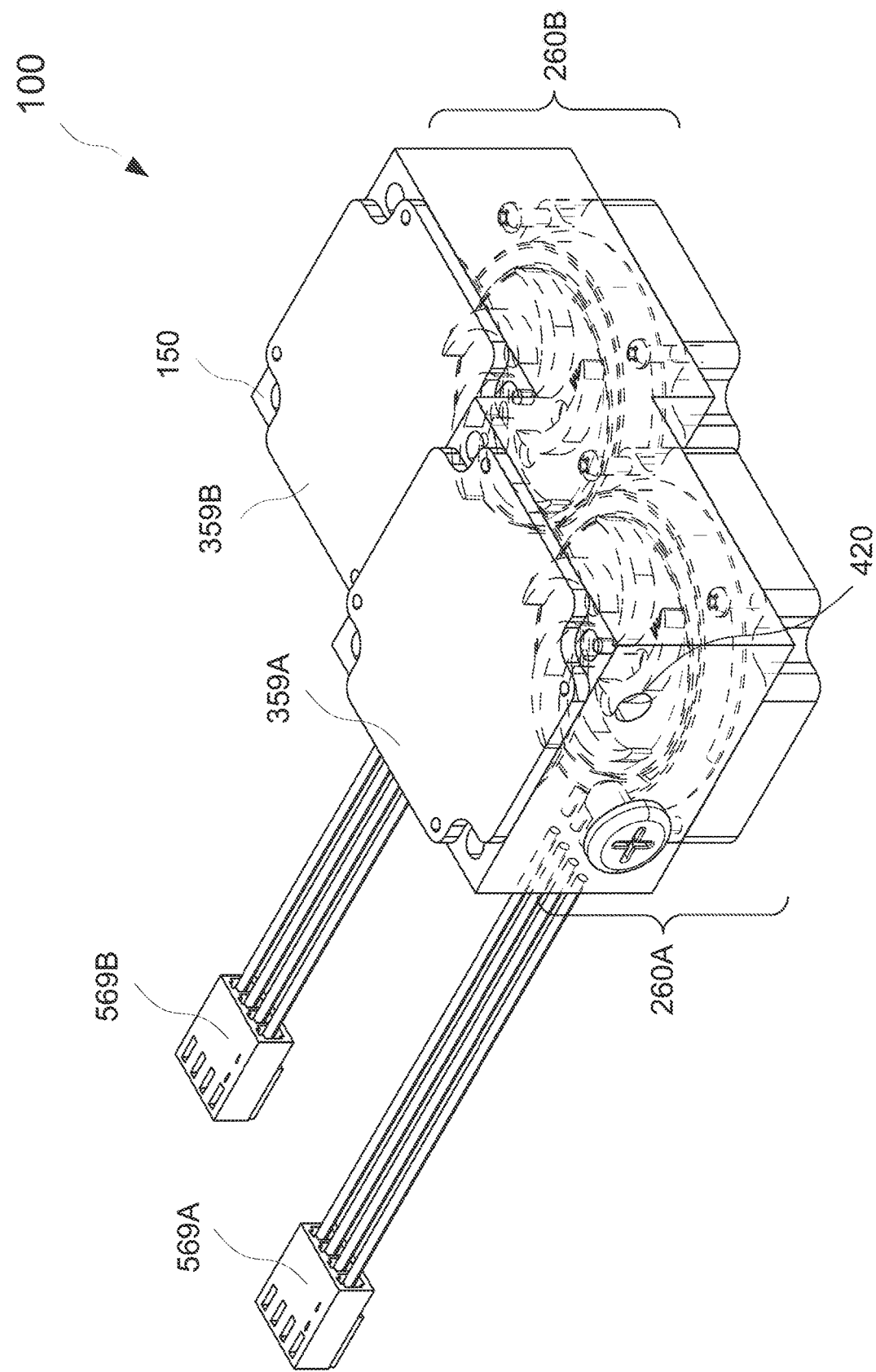

LIQUID COOLING MULTI-PUMPING UNIT

TECHNICAL FIELD

The following disclosure relates generally to the field of heat transfer and, more particularly, to liquid cooling multi-pumping units.

BACKGROUND

During operation of electric and electronic elements, devices and systems, the heat generated thereby, for example, by CPUs, processing units, or graphic boards, must be dissipated quickly and efficiently to keep operating temperature within manufacturer recommended ranges, under, at times, challenging operating conditions. As these elements, devices and systems increase in functionality and applicability, so does the power requirements thereof, and this in turn increases cooling requirements.

Several techniques have been developed for extracting heat from electric and electronic elements, devices and systems. One such technique is a liquid-cooling system, wherein a heat exchanger is in thermal contact with the elements, devices and/or systems, transporting heat away therefrom, and then cooling fluid, circulating inside of a cooling loop system incorporating the heat exchanger, flows over the heat exchanger by a pumping unit, removing heat therefrom. Heat is transferred from the heat source to the heat exchanger, the heat exchanger to the cooling fluid, and the cooling fluid to the environment by a radiator.

Generally, a maximum operating temperature of electric and electronic elements, devices and systems s defined and an appropriate liquid-cooling system dependent on a heat exchanger, radiator, and pump efficiency is provided. Pump efficiency, is determined by head and flow rate, in addition to cooling fluid properties, impeller design and motor speed. Given the same heat exchanger and radiator, when a required head is beyond the specifications of one pump, a much bigger and heavier or more than one pump is employed. However, costs, total installation time, risks for leakage, loss of parts, and total area requirements may increase.

SUMMARY

The above described disadvantages are overcome by embodiments of the present disclosure, which provide a liquid cooling multi-pumping unit, comprising first and second pumps arranged in series. The first pump preferably comprises a cooling fluid inlet connected to a first fluid chamber, the first fluid chamber in fluid connection with a first central chamber opening leading to a first pump chamber housing a first, pump mechanism, the first pump chamber comprising a first distribution channel in fluid communication with a second fluid chamber of the second pump. The second pump further comprises a second central chamber opening leading to a second pump chamber housing a second pump mechanism, the second pump chamber comprising a fluid outlet.

An exemplary liquid cooling multi-pumping unit of claim may further comprise first and second pump mechanisms comprising impellers, each with a plurality of curved blades. The first pump preferably comprises a first motor assembly that drives the first pump mechanism, and the second pump preferably comprises a second motor assembly that drives the second pump mechanism. The first pump chamber is preferably substantially coplanar with the second central chamber.

The first pump may comprise a first stator case connected to a first motor assembly, the first stator case housing a first stator and a first impeller having a plurality of curved blades. The second pump may comprise a second stator case connected to a second motor assembly, the second stator case housing a second stator and a second impeller having a plurality of curved blades. A side of the first impeller opposite the plurality of curved blades preferably corresponds in dimensions and depth to a side of the first stator casing opposite the first motor assembly. A side of the second impeller opposite the plurality of curved blades preferably corresponds in dimensions and depth to a side of the second stator casing opposite the second motor assembly.

The first and second pumps, and optionally a third or subsequent pumps, are preferably formed in a single main body. The first pump may further comprise a first pump cover and a first pump plate, and the second pump may further comprise a second pump cover and a second pump plate.

The first and second pumps are sealingly assembled to the main body. The first and second pump covers are sealingly assembled to the first and second fluid chambers, respectively.

BRIEF DESCRIPTION OF THE DRAWINGS

Unless specified otherwise, the accompanying drawings illustrate aspects of the exemplary embodiments described herein. Referring to the drawings, wherein like reference numerals indicate similar parts throughout the several views, several examples of heat exchanger systems incorporating aspects of the presently disclosed principles are illustrated by way of example, and not by way of limitation.

FIG. 1A is a schematic perspective first interior view of a liquid cooling multi-pumping unit, according to an exemplary embodiment.

DETAILED DESCRIPTION

Figure 1B:
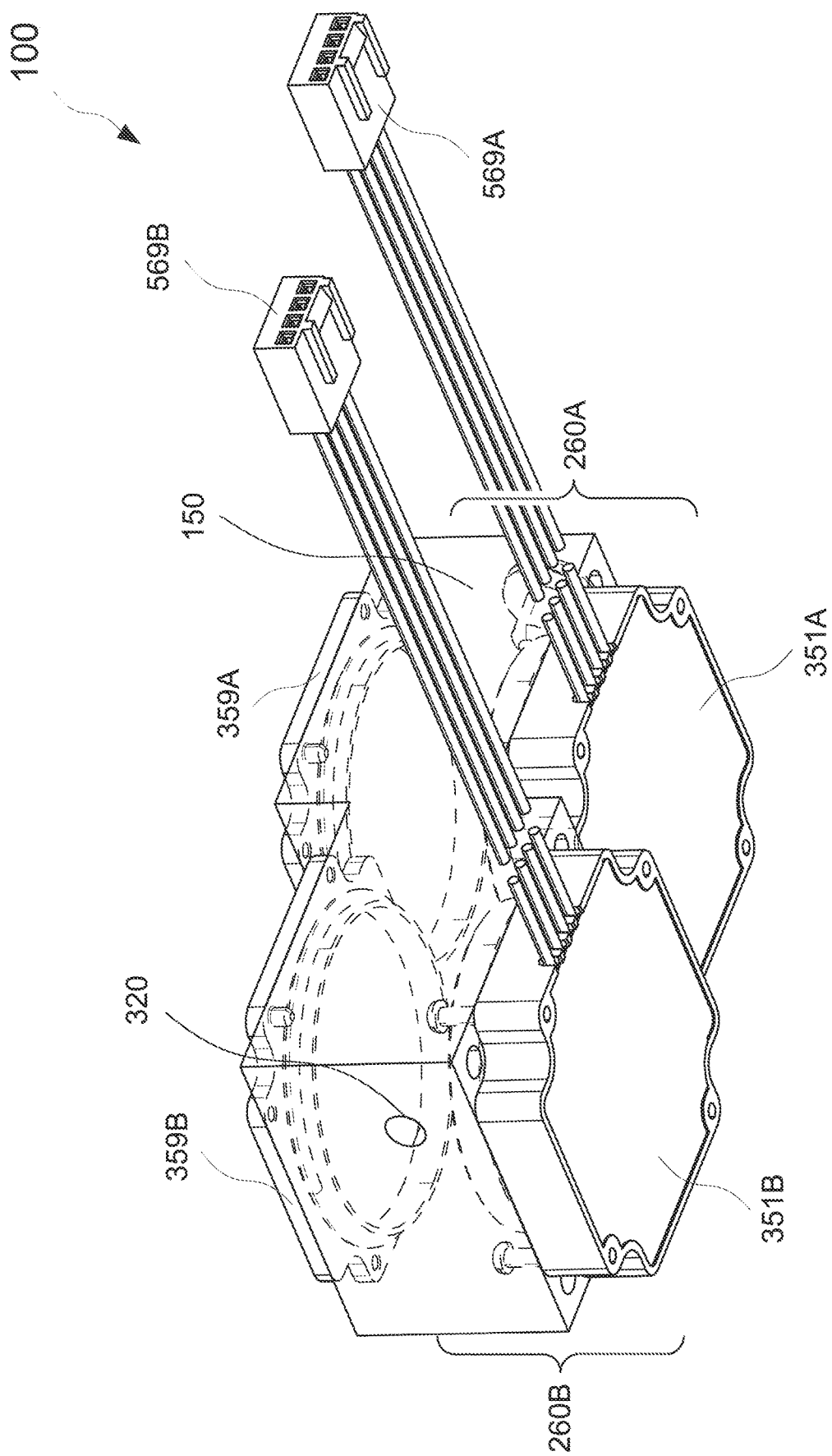
FIG. 1B is a schematic perspective second interior view of the liquid cooling multi-pumping unit of FIG. 1A, according to an exemplary embodiment.

The following describes various principles related to liquid cooling systems by way of reference to specific examples of heat exchangers and liquid cooling pumping units, including specific arrangements and examples of main bodies and multiple pumps embodying innovative concepts. More particularly, but not exclusively, such innovative principles are described in relation to selected examples of liquid cooling pumping units. Well-known functions or constructions are not described in detail for purposes of succinctness and clarity. Nonetheless, one or more of the disclosed principles can be incorporated in various other embodiments of liquid cooling pumping units to achieve any of a variety of desired outcomes, characteristics, and/or performance criteria.

Thus, liquid cooling pumping units having attributes that are different from those specific examples discussed herein can embody one or more of the innovative principles, and can be used in applications not described herein in detail. Accordingly, embodiments of liquid cooling pumping units not described herein in detail also fall within the scope of this disclosure, as will be appreciated by those of ordinary skill in the relevant art following a review of this disclosure.

Exemplary embodiments as disclosed herein are directed to liquid cooling systems and liquid cooling multi-pumping units, wherein a heat exchanger is in thermal contact with electric and/or electronic elements, devices and/or systems, transporting heat away therefrom, and then cooling fluid, circulating inside of a cooling loop system incorporating the heat exchanger via fluid conduits, flows over the heat exchanger by a multi-pumping unit, removing heat therefrom. The heated cooling fluid is output from the multi-pumping unit and input to a radiator. Next, the heated cooling fluid flows to and through the radiator, whereby, the radiator may have a plurality of heat fins thereon for increased heat dissipation. Then the cooling fluid flows from the radiator to the multi-pumping unit to once again begin the cooling loop. Although the cooling loop includes a multi-pumping unit, more than one multi-pumping unit may be coupled to the radiator. In this manner, multiple heat generating devices and/or a larger heat generating area may be cooled. Each of the multi-pumping units may be adjacently configured in rows or differently, allowing for design flexibility enabling application-specific configurations.

The liquid cooling system may be configured within a chassis or as part of an electric or electronics system that includes heat generating devices to be cooled. The liquid cooling system includes at least one liquid-based cooling loop, and may further comprise one or more fans. The one or more fans may be coupled to the back end of the radiator via a fastener (for example, bolts, screws, an adhesive material, and the like) at structural portions of the radiator, transporting air through the radiator to an air plenum or to an outside of the chassis or electric or electronics system. Those of ordinary skill in the relevant art may readily appreciate that the type and size of fans may be varied, as long as cooling fluid may be circulated through the radiator and air may be transferred through the radiator to an air plenum or to an outside of the chassis or electric or electronics system.

In some embodiments, the one or more fans may be high pressure (that is, high airflow) fans. In some embodiments, the one or more fans may have reinforced fan blades. In some embodiments, the design of the fan blades and/or other components (such as bearings, and so on) may be such that noise generated during operation may be minimized. In some embodiments, the fans may be constructed using fasteners (that is, anti-vibration rivets, gaskets, and the like) that may be used to minimized vibration during operation.

In an exemplary embodiment, a liquid cooling multi-pumping unit comprising a main body and first and second pumps arranged in series is provided. During operation, cooling fluid is sucked via a cooling fluid inlet into a first fluid chamber and then into a first central chamber opening to a plurality of curved blades of a first impeller assembled in a first pump chamber. From there, the cooling fluid travels and is sucked through a fluid distribution channel into a second fluid chamber and then into a second central chamber opening to a plurality of curved blades of a second impeller assembled in a second pump chamber, before exiting through a fluid outlet. The series arrangement of the first and second pumps increases head pressure, and provides sufficient liquid flow in the case where one liquid cooling pump fails. Additionally, lower energy consumption is achieved due to the lower operating speeds required.

Figure 2:
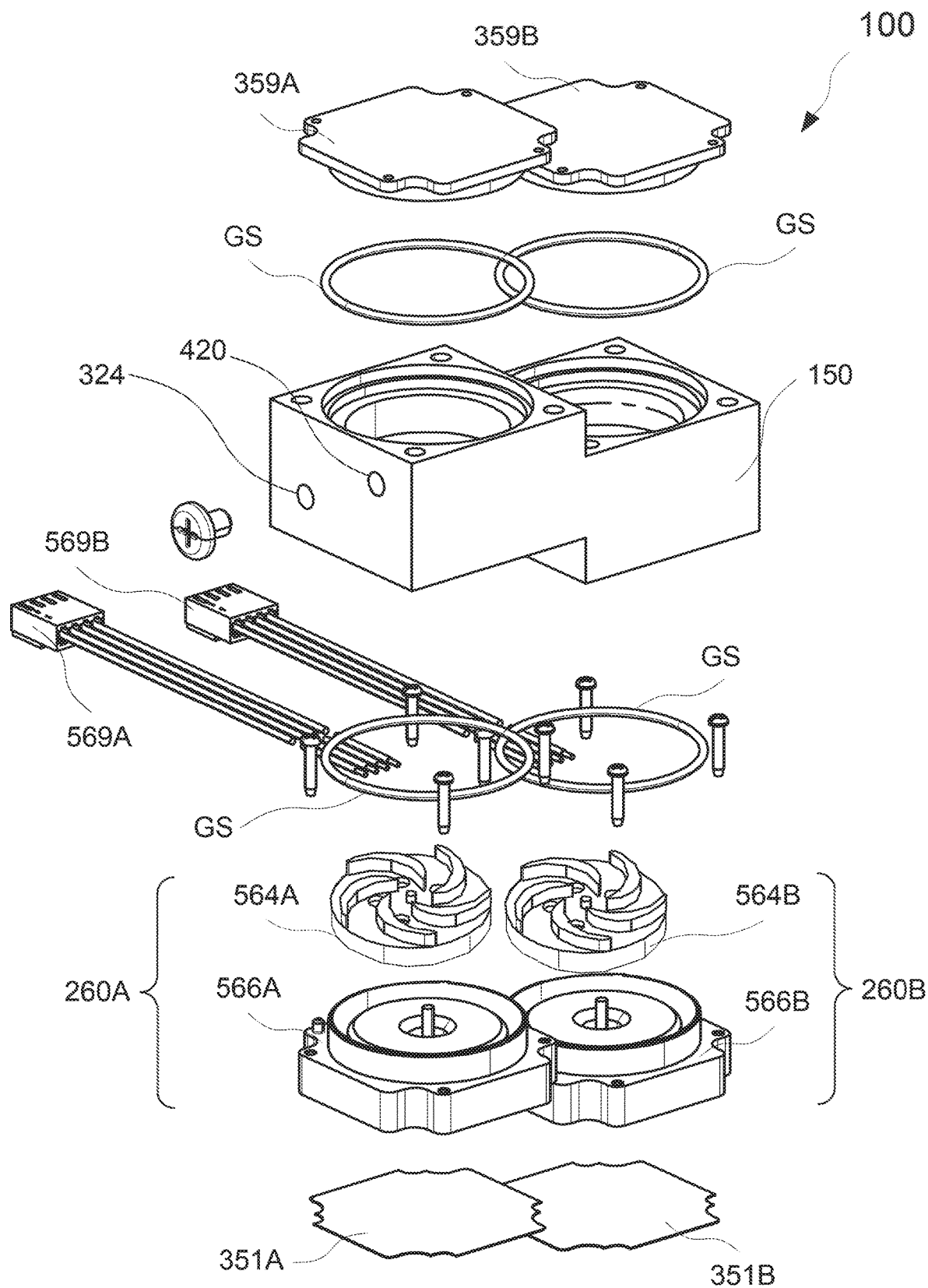
FIG. 2 is a schematic exploded view of the liquid cooling multi-pumping unit of FIG. 1A, according to an exemplary embodiment.
Figure 3A:
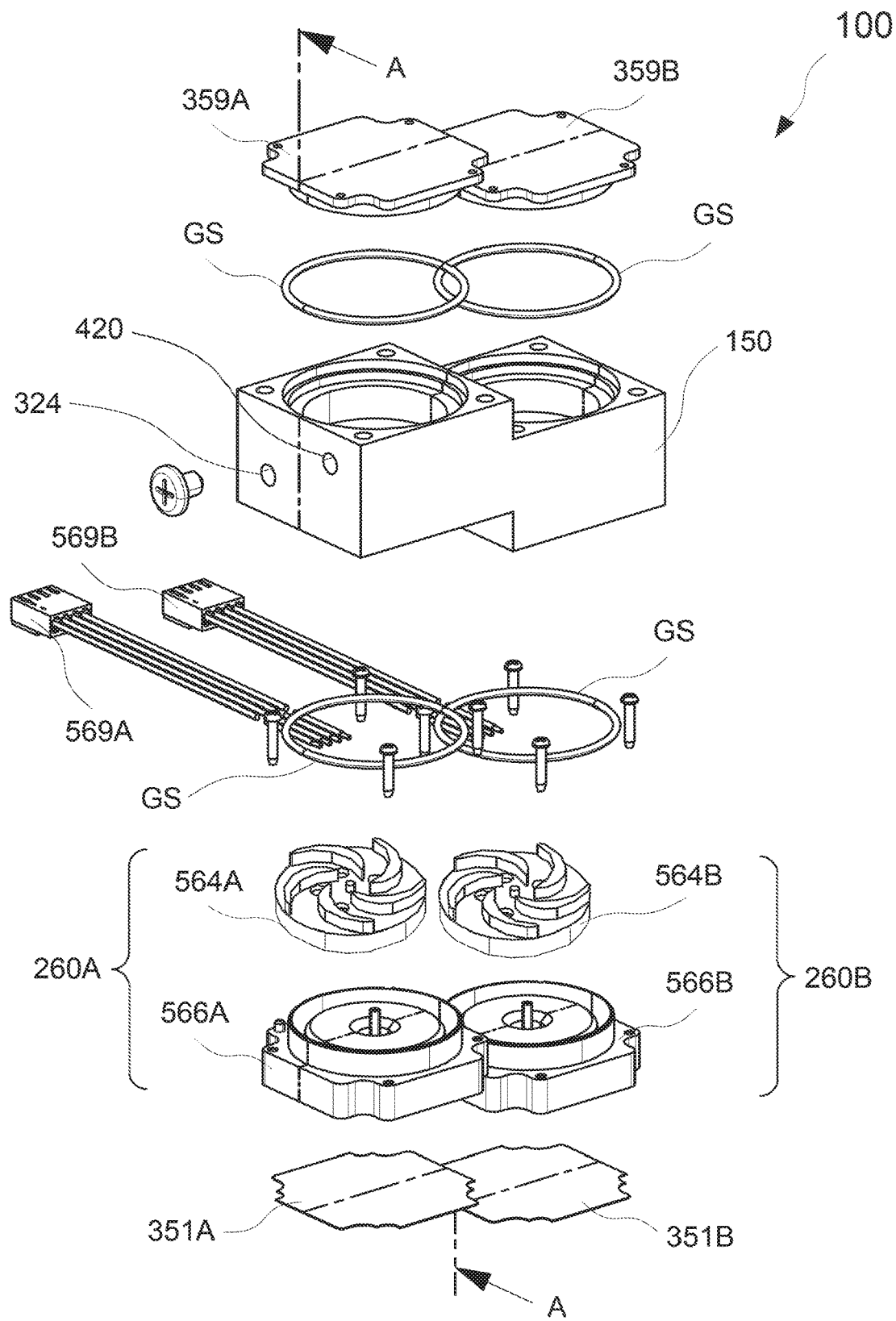
FIG. 3A is a schematic exploded view of the liquid cooling multi-pumping unit of FIG. 2 with line A-A, according to an exemplary embodiment.
Figure 3B:
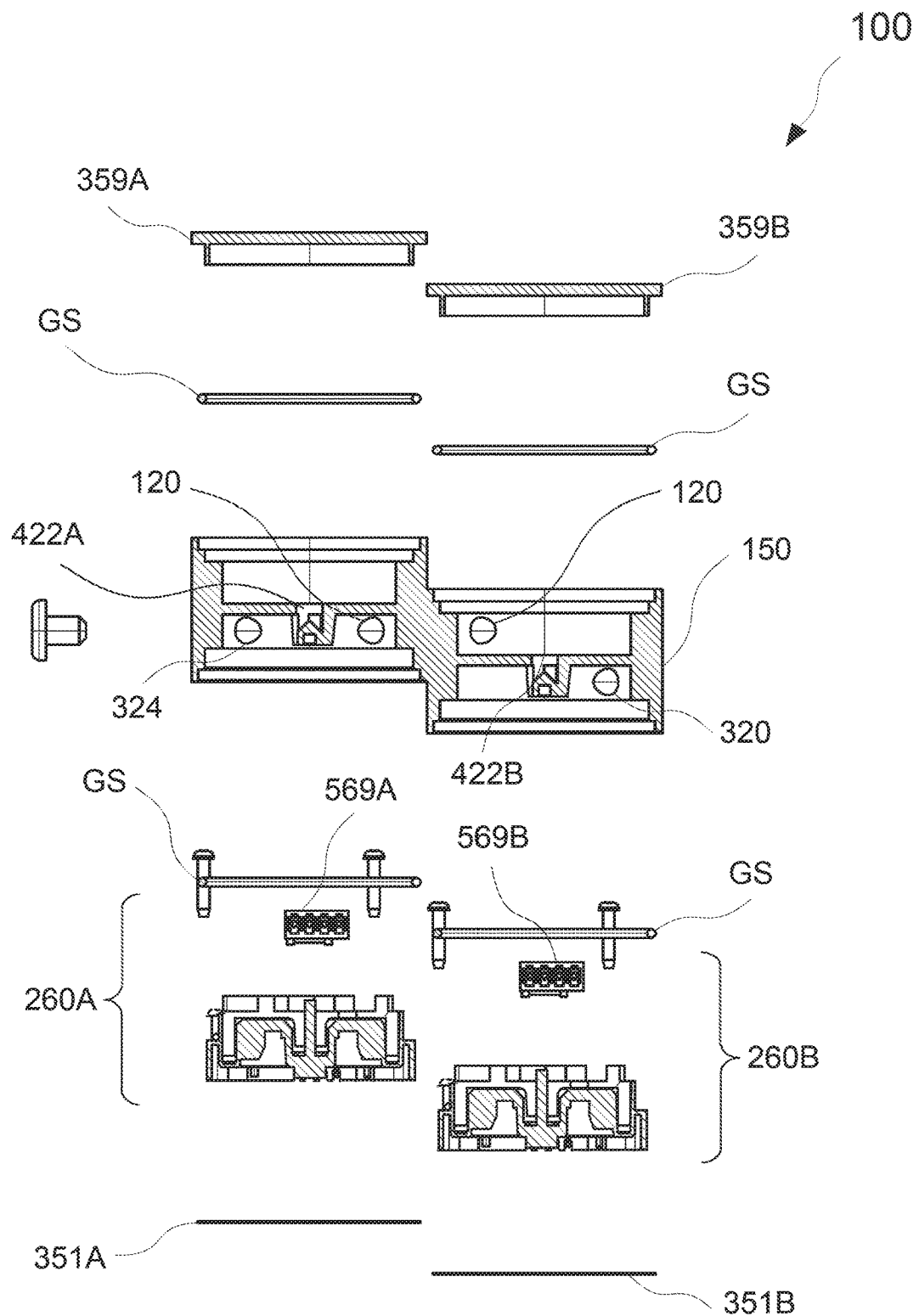
FIG. 3B is a schematic cross-sectional view of the liquid cooling multi-pumping unit along line A-A of FIG. 3A, according to an exemplary embodiment.
Figure 4A:
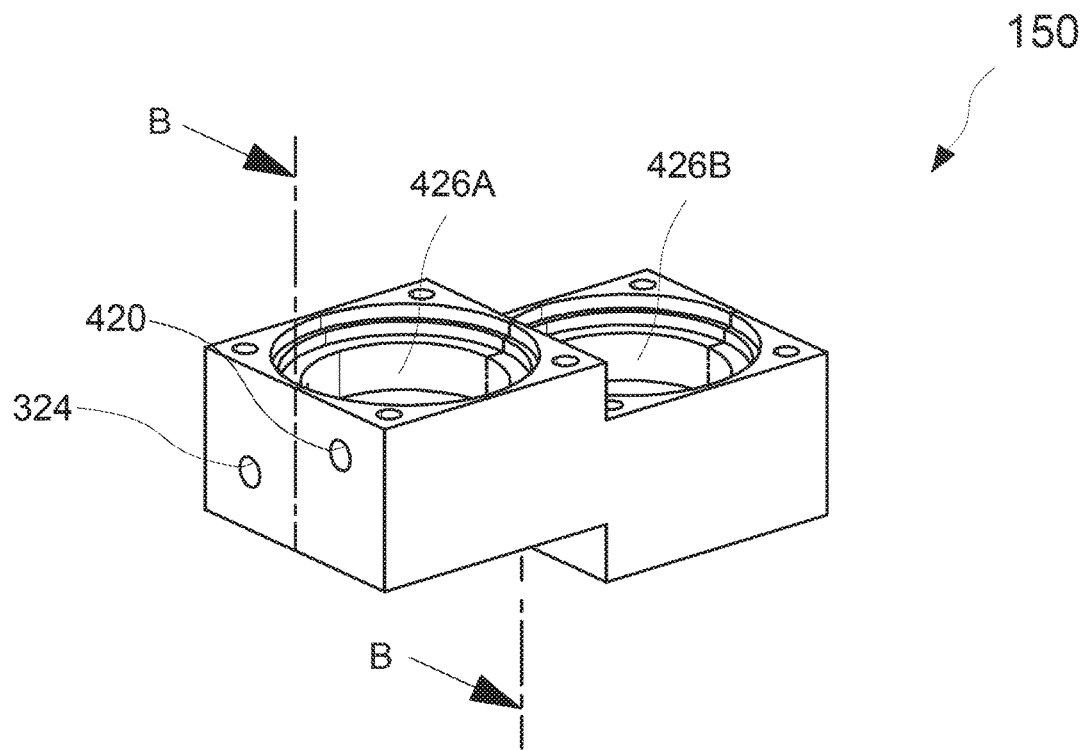
FIG. 4A is schematic perspective first view of the main body of the liquid cooling multi-pumping unit of FIG. 1A with line B-B, according to an exemplary embodiment.
Figure 4B:
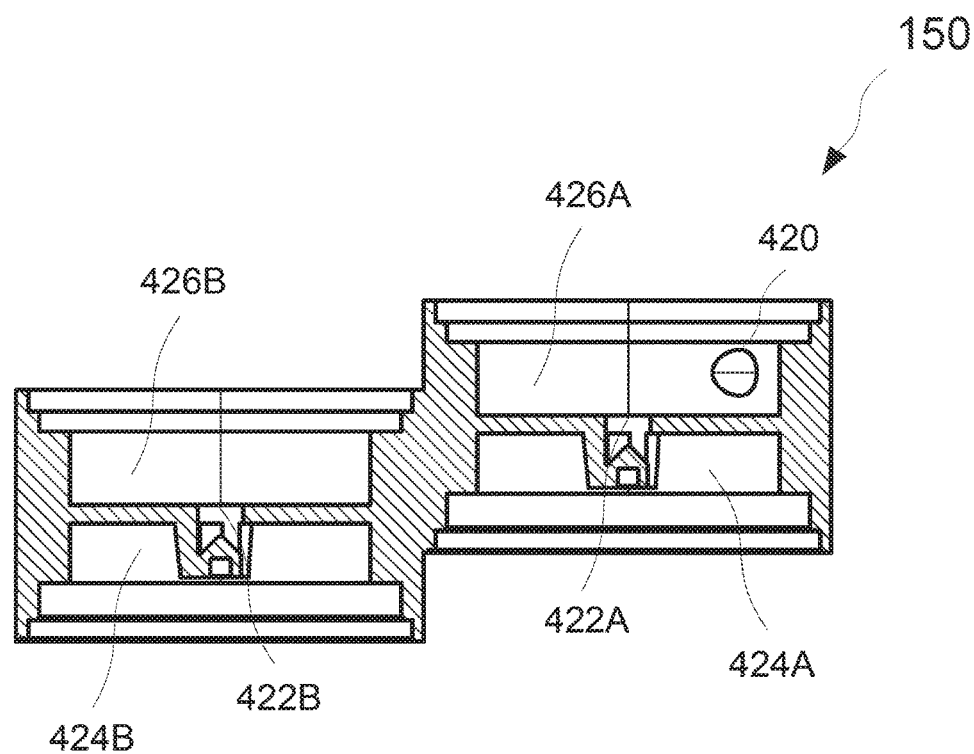
FIG. 4B is schematic cross-sectional view of the main body along line B-B of FIG. 4A, according to an exemplary embodiment.
Figure 5A:
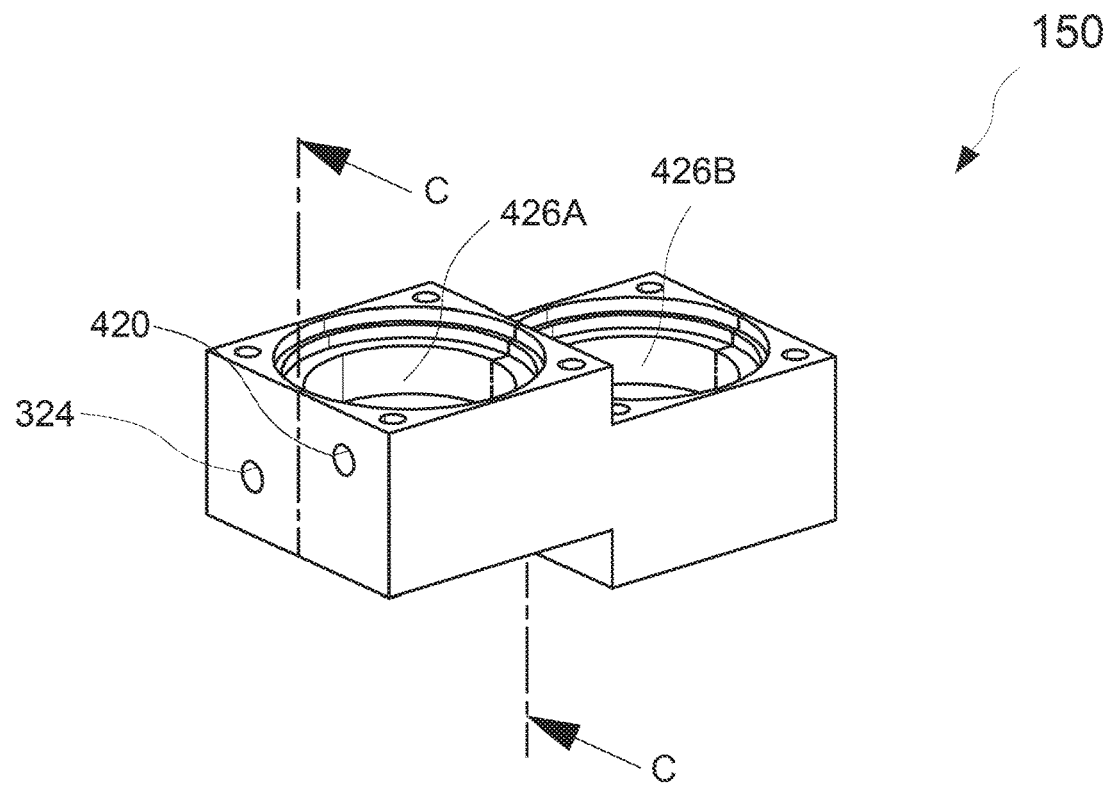
FIG. 5A is schematic perspective first view of the main body of the liquid cooling multi-pumping unit of FIG. 1A with line C-C, according to an exemplary embodiment.
Figure 5B:
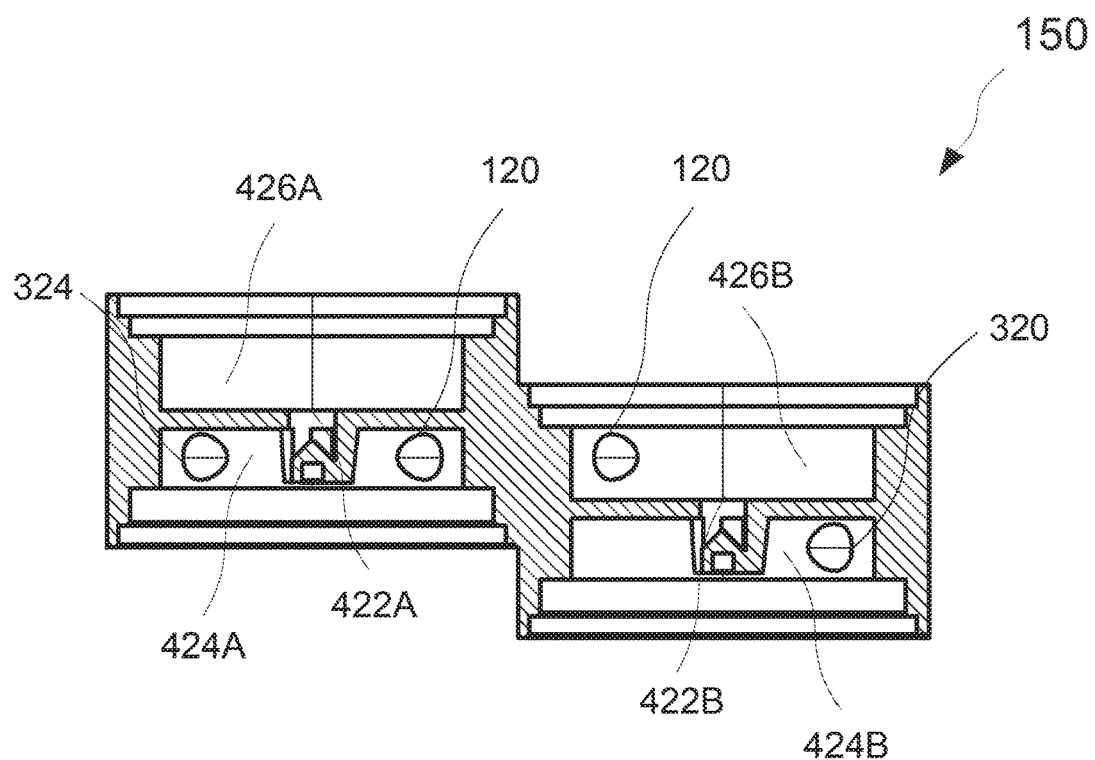
FIG. 5B is schematic cross-sectional view of the main body along line C-C of FIG. 5A, according to an exemplary embodiment.
Figure 6A:
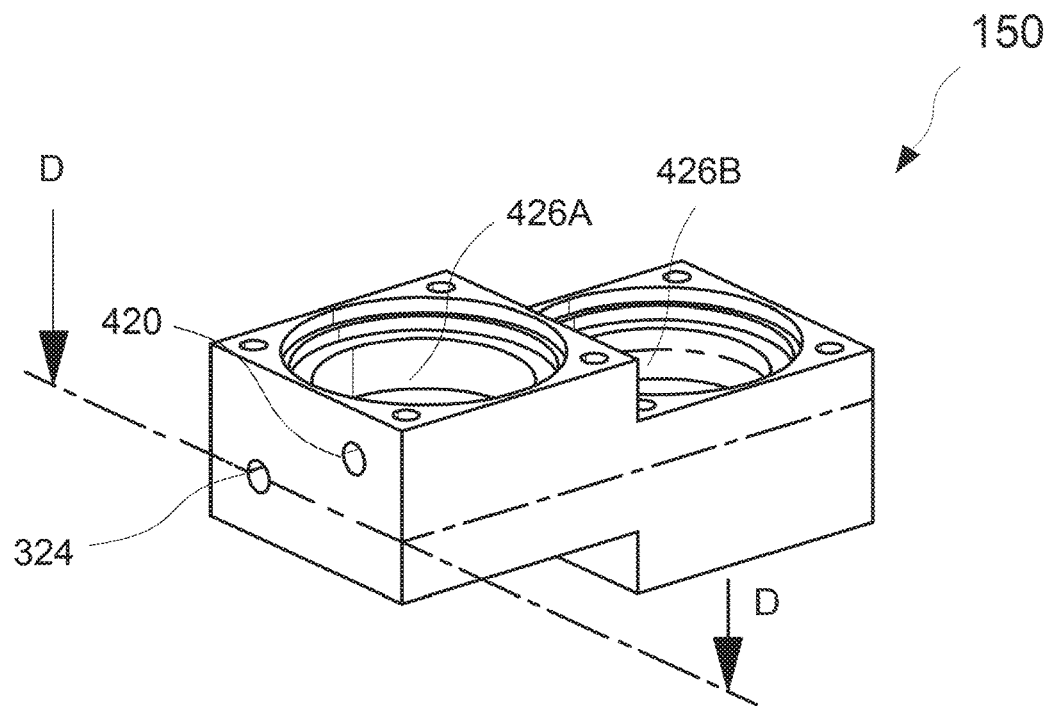
FIG. 6A is schematic perspective first view of the main body of the liquid cooling multi-pumping unit of FIG. 1A with line D-D, according to an exemplary embodiment.
Figure 6B:
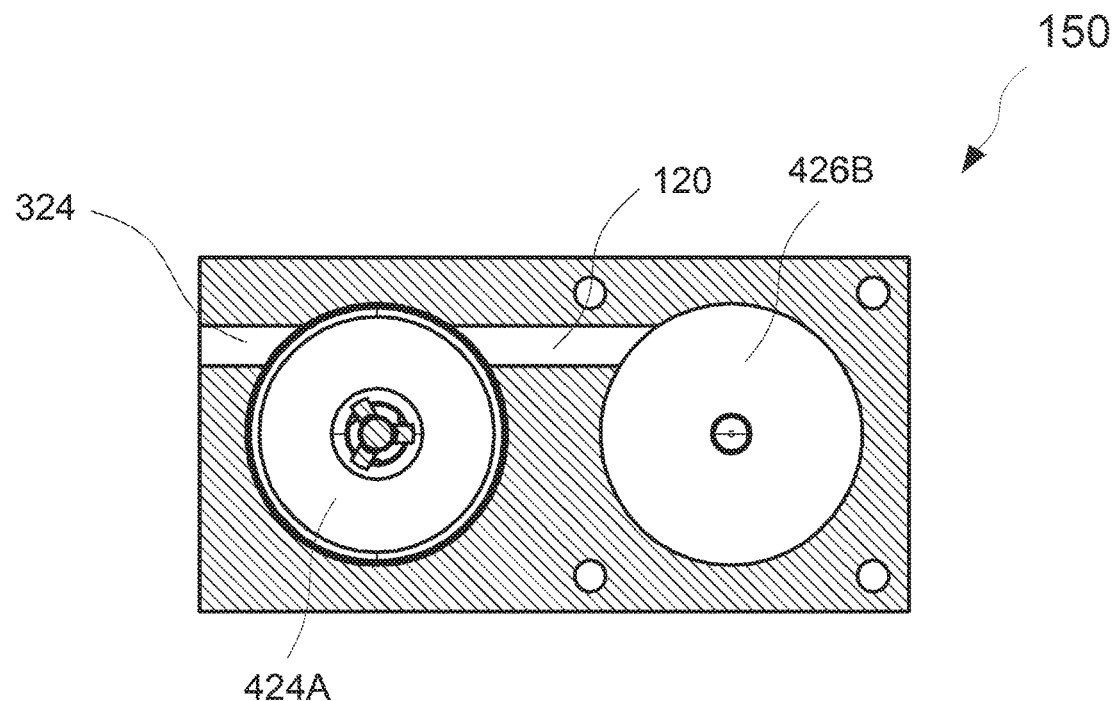
FIG. 6B is schematic cross-sectional view of the main body along line D-D of FIG. 6A, according to an exemplary embodiment.
Figure 7:
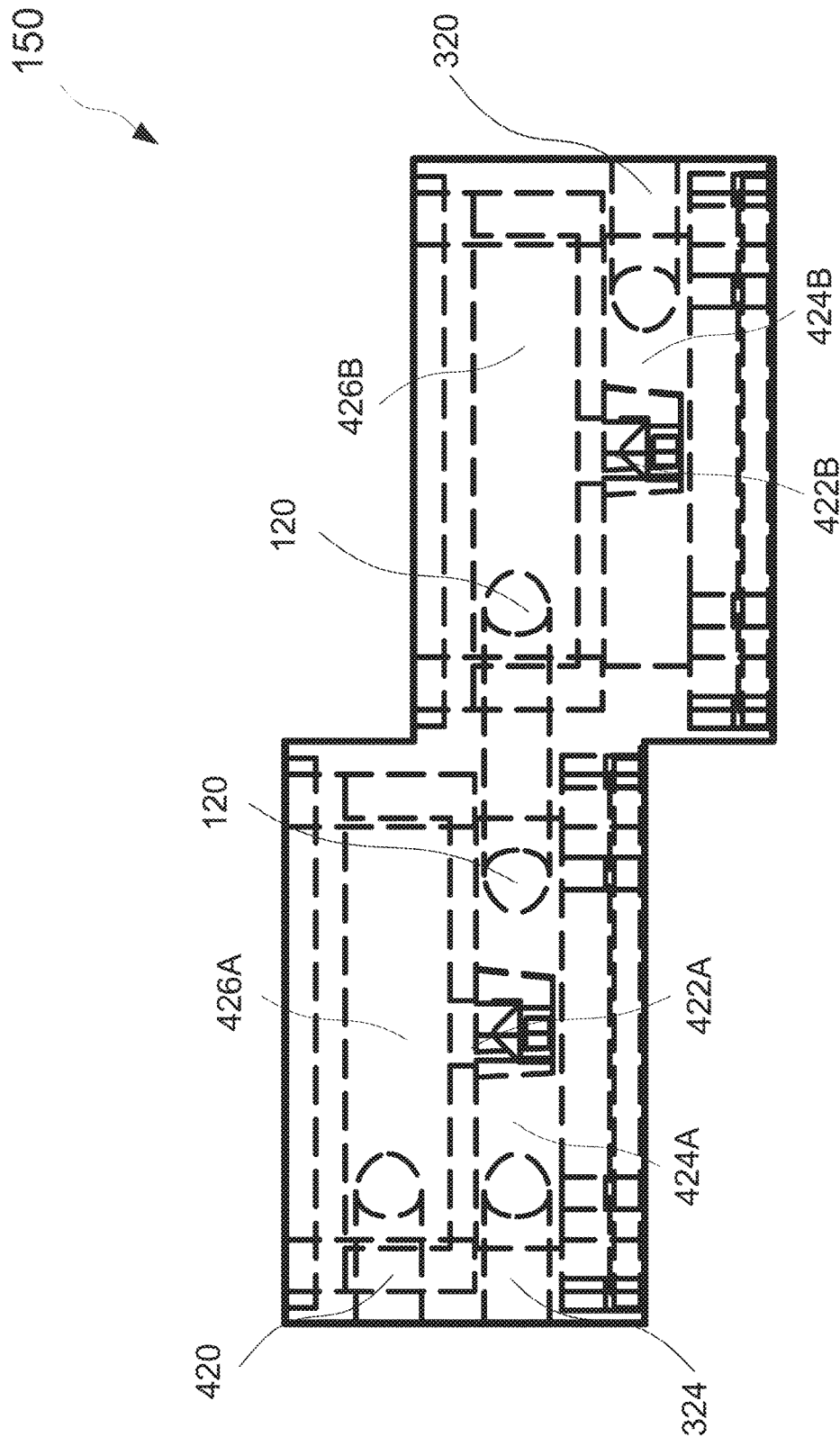
FIG. 7 is a schematic perspective third interior view of the main body of the liquid cooling multi-pumping unit of FIG. 1A, according to an exemplary embodiment.

FIG. 1A is a schematic perspective first interior view of a liquid cooling multi-pumping unit, according to an exemplary embodiment. FIG. 1B is a schematic perspective second interior view of the liquid cooling multi-pumping unit of FIG. 1A, according to an exemplary embodiment. FIG. 2 is a schematic exploded view of the liquid cooling multi-pumping unit of FIG. 1A, according to an exemplary embodiment. The liquid cooling system having the liquid cooling multi-pumping unit may be employed to cool at least one of an electric and/or electronic element, device and/or system. Referring to FIGS. 1A to 2, a liquid cooling multi-pumping unit 100 comprising a main body 150 and a plurality of pumps is provided. In some embodiments, the amount of the plurality of pumps is two, comprising a first pump 260A having a first motor assembly 569A and a second pump 260B having a second motor assembly 569B. As illustrated in FIGS. 3B to 7, the main body 150 comprises a first pump chamber 424A and a first fluid chamber 426A, in communication therewith via a first central chamber opening 422A and opposite therefrom, and a second pump chamber 424B and a second fluid chamber 426B, in communication therewith via a second central chamber opening 422B and opposite therefrom. The first fluid chamber 426B is positioned on a parallel plane to the first pump chamber 424A and the second fluid chamber 426B is positioned on a parallel plane to the second pump chamber 424B. The first pump chamber 424A is in communication with the second fluid chamber 426B. The openings of the first and second pump chambers 424A, 424B, respectively, are in a same direction, and the openings of the first and second fluid chambers 426A, 426B, respectively, are in a same direction. The first pump 260A is assembled within the first pump chamber 424A and corresponds, in dimensions and depth, thereto and the second pump 260B is assembled within the second pump chamber 424B and corresponds, in dimensions and depth, thereto.

The first pump 260A having the first motor assembly 569A, further comprises a first stator casing 566A having a first stator and a first impeller 564A having a plurality of curved blades, and the second pump 260B having the second motor assembly 569B, further comprises a second stator casing 566B having a second stator and a second impeller 564B also having a plurality of curved blades. A side of the first impeller 564A opposite the plurality of curved blades, corresponds, in dimensions and depth, to a side of the first stator casing 566A opposite the first motor assembly 569A, and is movably positioned there upon. A side of the second impeller 564B opposite the plurality of curved blades, corresponds, in dimensions and depth, to a side of the second stator casing 566B opposite the second motor assembly 569B, and is movably positioned there upon. The first and second motor assemblies 569A, 569B, first and second stator casings 566A, 566B, and first and second impellers 564A, 564B are assembled together to form the first and second pumps 260A, 260B. The main body 150, first and second motor assemblies 569A, 569B, first and second stator casings 566A, 566B, and first and second impellers 564A, 564B are parallel assembled, respectively, and integrated on planes which are parallel.

In some embodiments, the first and second impellers 564A, 564B have a shape and a design intended only for one way rotation, a clock-wise rotation. Thereby, the efficiency of the first and second impellers 564A, 564B is increased when compared to impellers capable of and intended for both clock-wise and counter clock-wise rotation.

The liquid cooling multi-pumping unit 100 further comprises a first pump cover 359A and a first pump plate 351A, a second pump cover 359B and a second pump plate 351B, and a plurality of gasket sealants GS. The first and second pump plates 351A, 351B are secured to the first and second pumps 260A, 260B, respectively, the first and second pumps 260A, 260B are sealingly assembled to the main body 150, respectively, and the first and second pump covers 359A, 359B are sealingly assembled to the first and second fluid chambers 426A, 426B, respectively. The first and second pump plates 351A, 351B, first and second pumps 260A, 260B, the main body 150, and first and second pump covers 359A, 359B are secured together and may be sealingly assembled, respectively, by the plurality of gasket sealants GS and bolts (not always shown). However, the embodiments are not limited thereto. Those of ordinary skill in the relevant art may readily appreciate that other convenient sealants and fastening means may also be used, so long as a secure or liquid tight connection can be achieved where required. In some embodiments, the plurality of gasket sealants GS are circular-shaped and tightly fit into indented rimmed step portions of the main body 150, respectively.

The main body 150, first and second motor assemblies 569A, 569B, first and second stator casings 566A, 566B, and stators, first and second impellers 564A, 564B, first and second pump covers 359A, 359B, and first and second pump plates 351A, 351B as an example, and not to be limiting, may be made of metal, plastic and/or any combination thereof. Metal minimizes fluid diffusion or evaporation of the fluid. The metal may be provided as a thin layer of metal coating provided on either or on both of the internal or the external sides of plastic parts. Generally, the same metal material is used throughout the cooling loop (the radiator, and so on), such as, copper. The fluid conduits may be flexible and/or rigid.

Referring to FIGS. 3A to 7, and referring to FIGS. 1A to 2, the main body 150 of the liquid cooling multi-pumping unit 100 further comprises a fluid inlet 420, a fluid distribution channel 120, and a fluid outlet 320. The fluid inlet 420 is in communication with the first fluid chamber 426A and positioned on a fourth side of the main body 150, the fluid outlet 320 is in communication with the second pump chamber 424B and positioned on a fifth side of the main body 150, opposite the fourth side, and the fluid distribution channel 120 is positioned between the first pump chamber 424A and second fluid chamber 426A. In some embodiments, the amount of the fluid distribution channel 120 is one, and the fluid distribution channel 120 is generally straight and positioned on a plane that is parallel to the first pump chamber 424A and second fluid chamber 426A; however, the embodiments are not limited thereto. Those of ordinary skill in the relevant art may readily appreciate that there may be more than one fluid distribution channel 120 and the fluid distribution channel 120 may not be generally straight and/or positioned on a plane that is parallel to the first pump chamber 424A and second fluid chamber 426A.

As long as the fluid distribution channel 120 is in communication with both the first pump chamber 424A and second fluid chamber 426A and cooling fluid is able to freely flow therethrough.

In some embodiments, the liquid cooling multi-pumping unit 100 further comprises a secondary opening 324. The secondary opening 324 is in communication with the first pump chamber 424A and positioned on the fourth side of the main body 150, diagonal to the fluid inlet 420. Those of ordinary skill in the relevant art may readily appreciate that the secondary opening 324 provides an additional feature for fluid distribution of the first pump chamber 424A, and may be incorporated in various other embodiments of liquid cooling pumping units to achieve any of a variety of desired outcomes, characteristics, and/or performance criteria.

During operation of the liquid cooling multi-pumping unit 100, the first and second motor assemblies 569A, 569B of the first and second pumps 260A, 260B, respectively, rotate the first and second impellers 564A, 564B in series. Cooling fluid is sucked via the cooling fluid inlet 420 into the first fluid chamber 426A and then into the first central chamber opening 422A to the plurality of curved blades of the first impeller 564A assembled in the first pump chamber 424A. From there, the cooling fluid travels and is sucked through the fluid distribution channel 120 into the second fluid chamber 426B and thereinto the second central chamber opening 422B to the plurality of curved blades of the second impeller 564B assembled in the second pump chamber 424B, before exiting outward through the fluid outlet 320. The first and second fluid chambers 426A, 426B communicate directly with the first and second pump chambers 424A, 424B, respectively, ensuring lubrication of the liquid cooling multi-pumping unit 100 and heat transfer, avoiding damage and failure thereof.

In some embodiments, the amount of the plurality of pumps is two, comprising the first and second pumps 260A, 260B, and the first and second pumps 260A, 260B are staggeredly positioned to allow for gravity to assist in increasing cooling fluid flow from the first and second fluid chambers 426A, 426B to the first and second pump chambers 424A, 424B; however, the embodiments are not limited thereto. In alternative embodiments, the amount of the plurality of pumps is more than two, and the plurality of pumps may not be staggeredly positioned. As long as cooling fluid may be sucked via a cooling fluid inlet into a fluid chamber and then into a central chamber opening to a plurality of curved blades of an impeller, and then travel and be sucked through a fluid distribution channel into another fluid chamber and then into another central chamber opening to another plurality of curved blades of an another impeller, and so on, before eventually exiting outward through a fluid outlet and the fluid chambers communicate directly with the pump chambers, respectively, ensuring lubrication and heat transfer of the liquid cooling multi-pumping unit, avoiding damage and failure thereof.

Figure 8A:
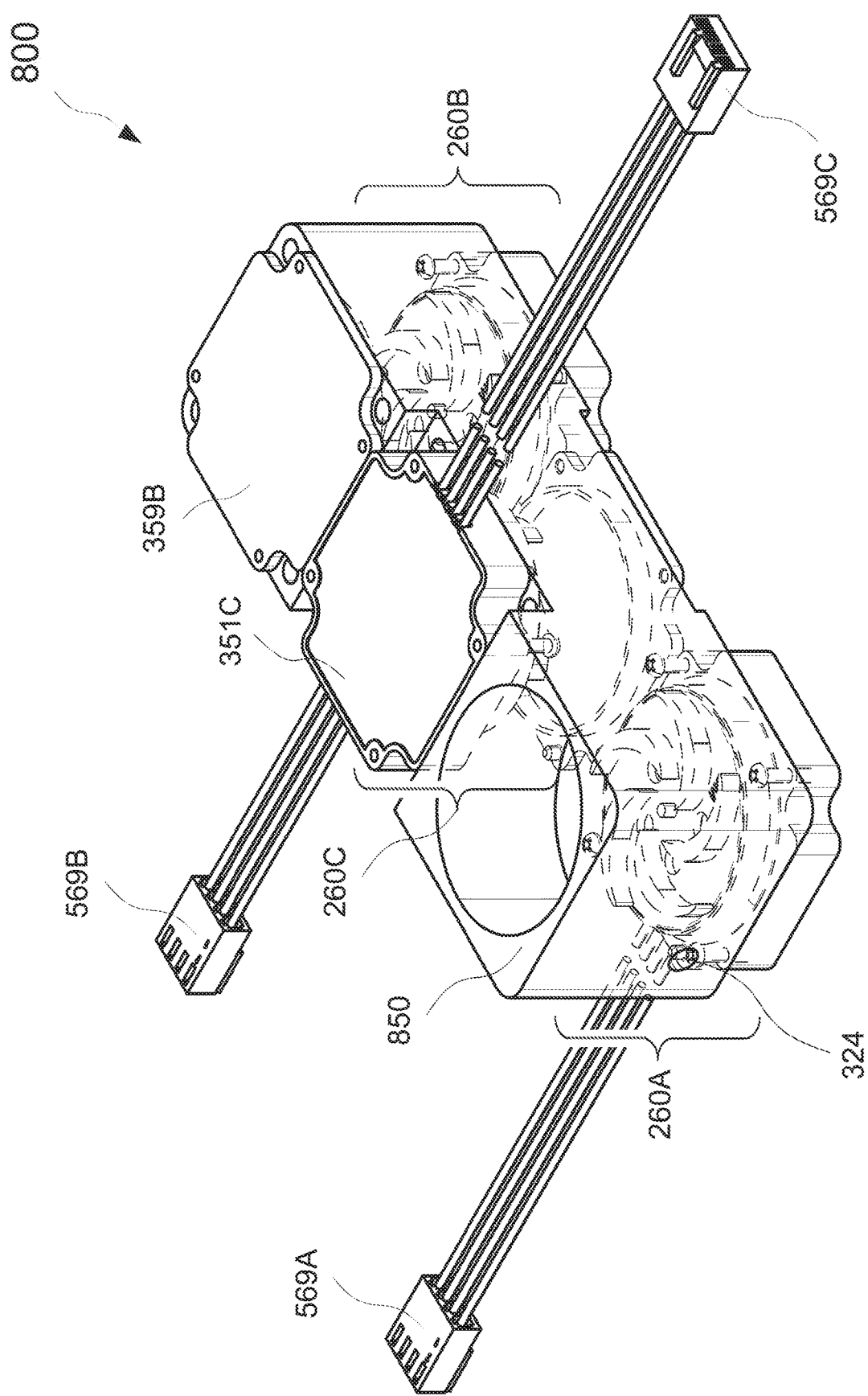
FIG. 8A is a schematic perspective first interior view of an alternative liquid cooling multi-pumping unit, according to an exemplary embodiment.
Figure 8B:
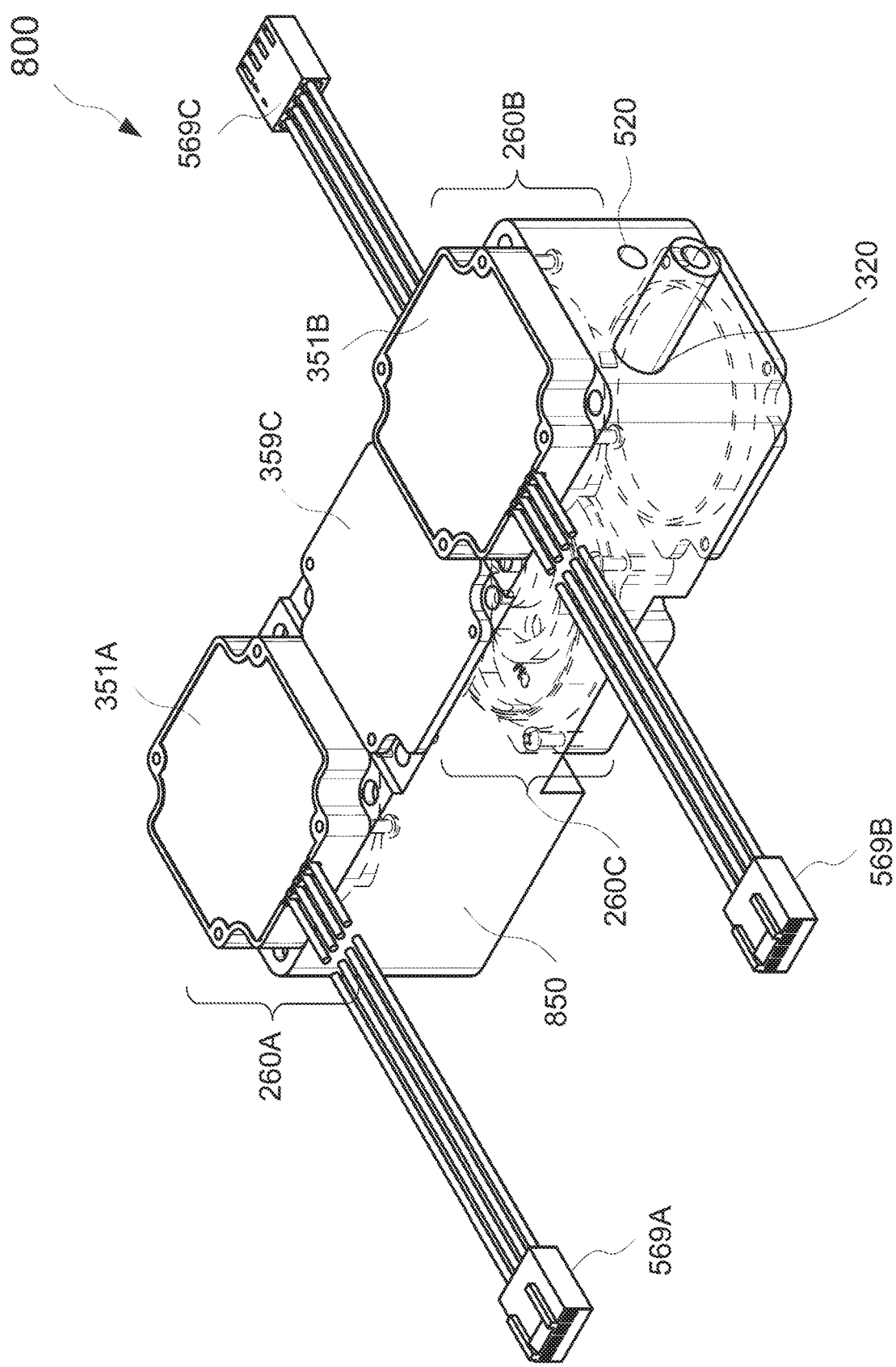
FIG. 8B is a schematic perspective second interior view of the alternative liquid cooling multi-pumping unit of FIG. 8A, according to an exemplary embodiment.
Figure 9:
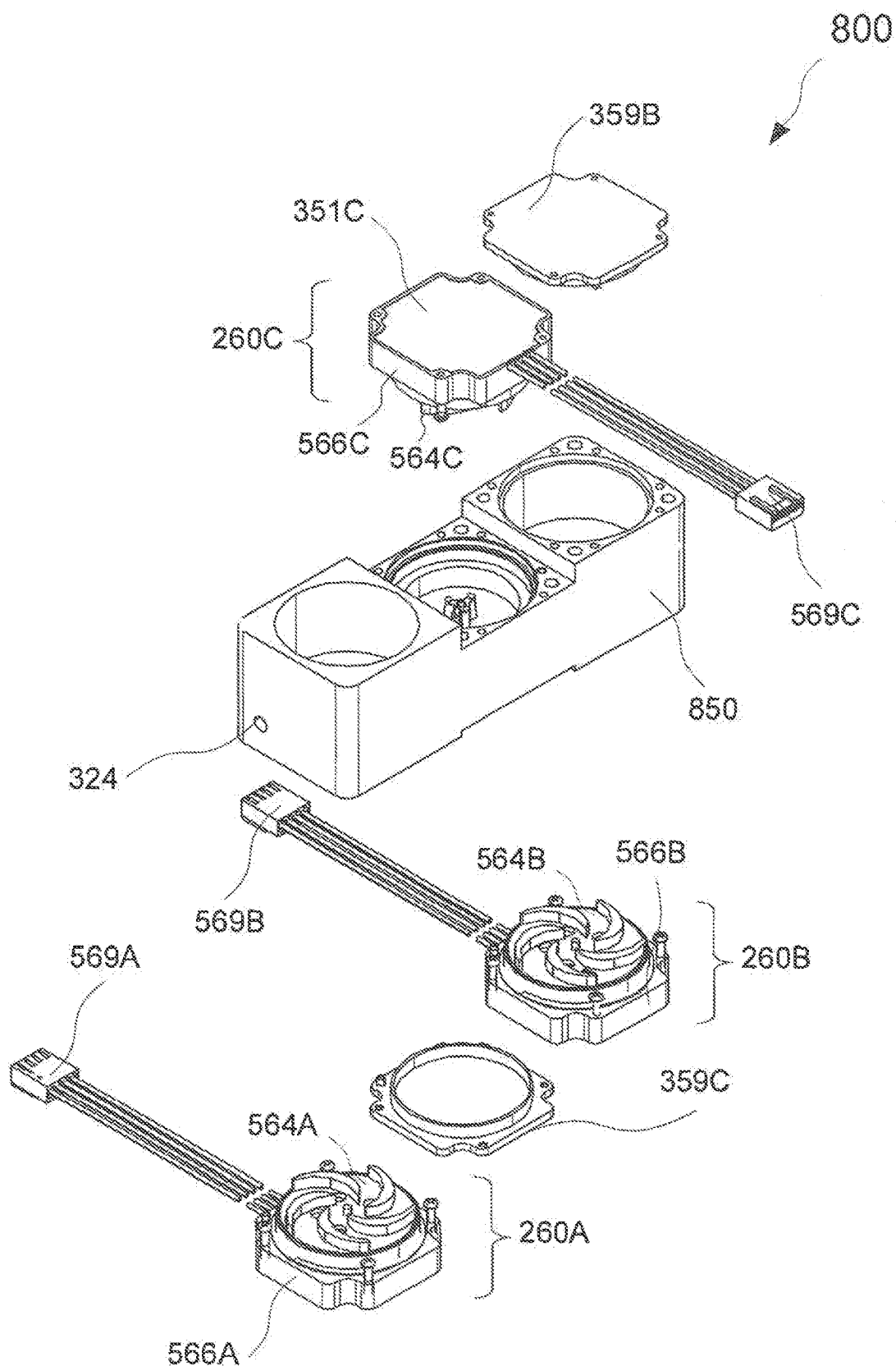
FIG. 9 is a schematic exploded view of the alternative liquid cooling multi-pumping unit of FIG. 8A, according to an exemplary embodiment.

FIG. 8A is a schematic perspective first interior view of an alternative liquid cooling multi-pumping unit, according to an exemplary embodiment. FIG. 8B is a schematic perspective second interior view of the alternative liquid cooling multi-pumping unit of FIG. 8A, according to an exemplary embodiment. FIG. 9 is a schematic exploded view of the alternative liquid cooling multi-pumping unit of FIG. 8A, according to an exemplary embodiment. Referring to FIGS. 8A to 9, a liquid cooling multi-pumping unit 800 comprising a main body 850 and a plurality of pumps is provided. In some embodiments, the amount of the plurality of pumps is three, comprising a first pump 860A having a first motor assembly 569A, a third pump 860C having a third motor assembly 569C, and a second pump 260B having a second motor assembly 569B. The main body 850 comprises a first pump chamber 424A and a first fluid chamber 826A, in communication therewith via a first central chamber opening 422A and opposite therefrom, a third pump chamber 424C and a third fluid chamber 426C, in communication therewith via a third central chamber opening 422C and opposite therefrom, and a second pump chamber 424B and a second fluid chamber 826B, in communication therewith via a second central chamber opening 422B and opposite therefrom. The first fluid chamber 826B is positioned on a parallel plane to the first pump chamber 424A the third fluid chamber 426C is positioned on a parallel plane to the third pump chamber 424C, and the second fluid chamber 826B is positioned on a parallel plane to the second pump chamber 424B. The first pump chamber 424A is in communication with the third fluid chamber 426C, and the third pump chamber 424C is in communication with the second fluid chamber 826B. The openings of the first and second pump chambers 424A, 424B, respectively, are in a same direction, and opposite the opening of the third pump chamber 424C, and the openings of the first and second fluid chambers 826A, 826B, respectively, are in a same direction, opposite the opening of the third fluid chamber 426C. The first pump 260A is assembled within the first pump chamber 424A and corresponds, in dimensions and depth, thereto, the third pump 260C is assembled within the third pump chamber 424C and corresponds, in dimensions and depth, thereto, and the second pump 260B is assembled within the second pump chamber 424B and corresponds, in dimensions and depth, thereto.

The first pump 260A having the first motor assembly 569A, further comprises a first stator casing 566A having a first stator and a first impeller 564A having a plurality of curved blades. The third pump 260C having the third motor assembly 569C, further comprises a third stator casing 566C having a third stator and a third impeller 564C having a plurality of curved blades. The second pump 260B having the second motor assembly 569B, further comprises a second stator casing 566B having a second stator and a second impeller 564B also having a plurality of curved blades. A side of the first impeller 564A opposite the plurality of curved blades, corresponds, in dimensions and depth, to a side of the first stator casing 566A opposite the first motor assembly 569A, and is movably positioned there upon. A side of the third impeller 564C opposite the plurality of curved blades, corresponds, in dimensions and depth, to a side of the third stator casing 566C opposite the third motor assembly 569C, and is movably positioned there upon. A side of the second impeller 564B opposite the plurality of curved blades, corresponds, in dimensions and depth, to a side of the second stator casing 566B opposite the second motor assembly 569B, and is movably positioned there upon. The first, third and second motor assemblies 569A, 569C, 569B, first, third and second stator casings 566A, 566C, 566B, and first, third and second impellers 564A, 564C, 564B are assembled together to form the first, third and second pumps 260A, 260C, 260B. The main body 850, first, third and second motor assemblies 569A, 569C, 569B, first, third and second stator casings 566A, 566C, 566B, and first, third and second impellers 564A, 564C, 564B are parallel assembled. respectively, and integrated on planes which are parallel.

In some embodiments, the first, third and second impellers 564A, 564C, 564B have a shape and a design intended only for one way rotation, a clock-wise rotation. Thereby, the efficiency of the first, second and third impellers 564A, 564C, 564B is increased when compared to impellers capable of and intended for both clock-wise and counter clock-wise rotation.

The liquid cooling multi-pumping unit 800 further comprises a first pump plate 351A, a third pump cover 359C and a third pump plate 351C, and a second pump cover 359B and a second pump plate 351B, and a plurality of gasket sealants GS (not shown). The first, third and second pump plates 351A, 351C, 351B are secured to the first, third and second pumps 260A, 260C, 260B, respectively, the first, third and second pumps 260A, 260C, 260B are sealingly assembled to the main body 850, respectively, and the third and second pump covers 359C, 359B are sealingly assembled to the third and second fluid chambers 426C, 826B, respectively. The first, third and second pump plates 351A, 351C, 351B, first, third and second pumps 260A, 260C, 260B the main body 850, and third and second pump covers 359C, 359B are secured together and may be sealingly assembled, respectively, by the plurality of gasket sealants GS and bolts (not always shown). However, the embodiments are not limited thereto. Those of ordinary skill in the relevant art may readily appreciate that other convenient sealants and fastening means may also be used, so long as a secure or liquid tight connection can be achieved where required. In some embodiments, the plurality of gasket sealants GS are circular-shaped and tightly fit into indented rimmed step portions of the main body 150 respectively.

The main body 850, first, third and second motor assemblies 569A, 569C, 569B, first, third and second stator casings 566A, 566C, 566B, and stators, first, third and second impellers 564A, 564C, 564B, third and second pump covers 359C, 359B, and first, third and second pump plates 351A, 351C, 351B as an example, and not to be limiting, may be made of metal, plastic and/or any combination thereof.

Figure 10A:
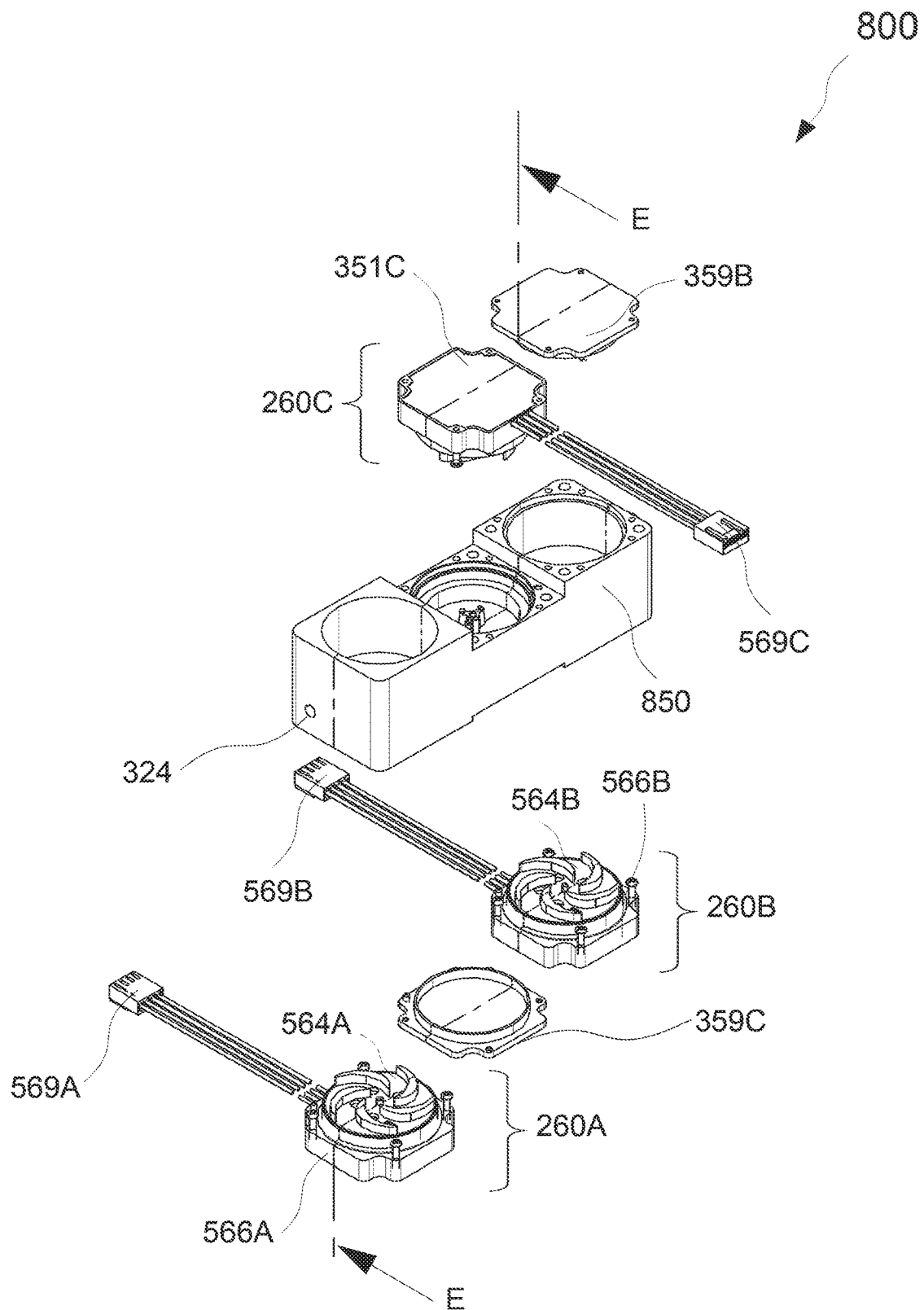
FIG. 10A is a schematic exploded view of the alternative liquid cooling multi-pumping unit of FIG. 9 with line E-E, according to an exemplary embodiment.
Figure 10B:
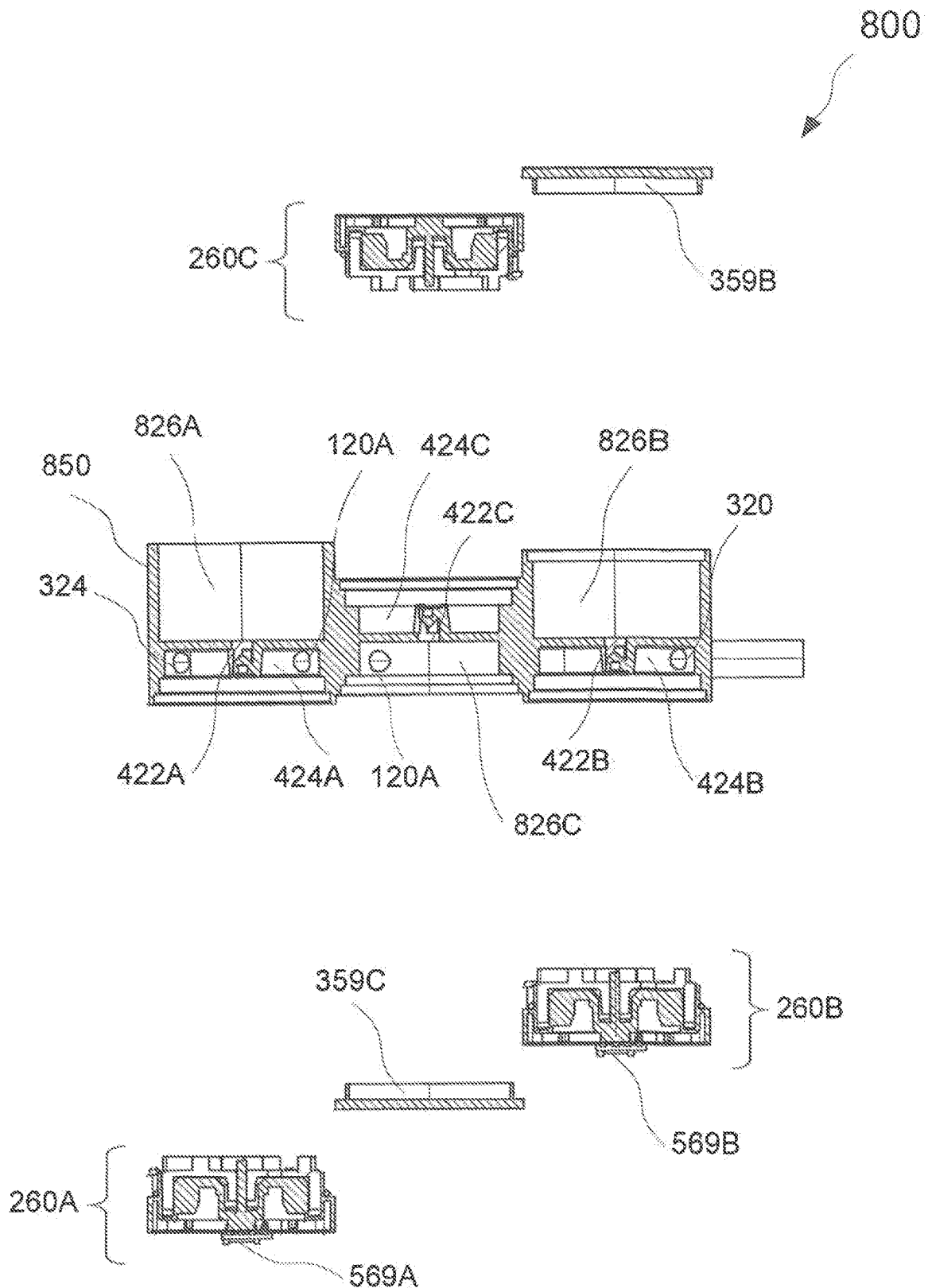
FIG. 10B is a schematic cross-sectional view of the alternative liquid cooling multi-pumping unit along line E-E of FIG. 10A, according to an exemplary embodiment.
Figure 11A:
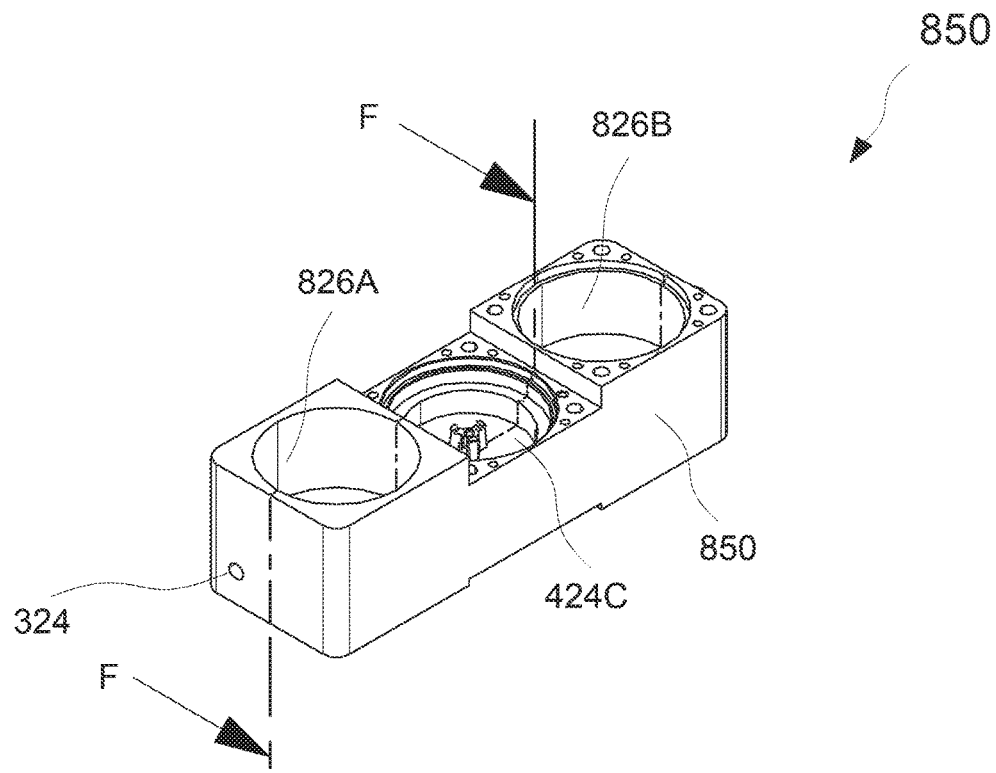
FIG. 11A is schematic perspective first view of the main body of the alternative liquid cooling multi-pumping unit of FIG. 8A with line F-F, according to an exemplary embodiment.
Figure 11B:
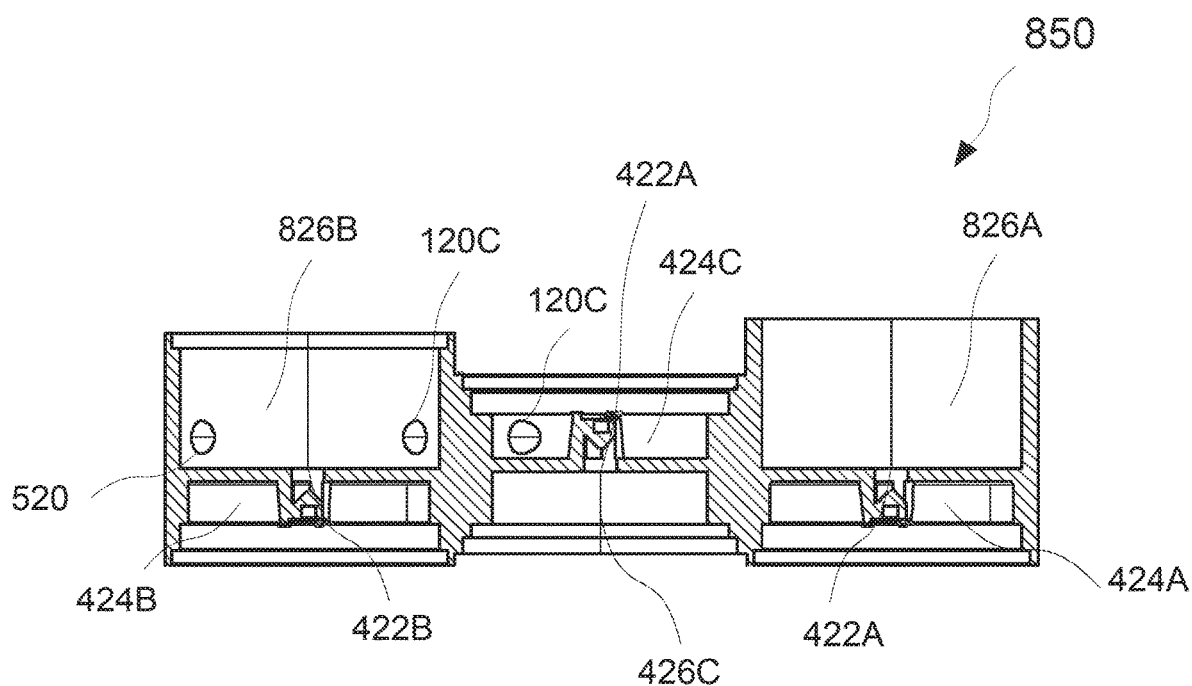
FIG. 11B is schematic cross-sectional view of the main body along line F-F of FIG. 11A, according to an exemplary embodiment.
Figure 12A:
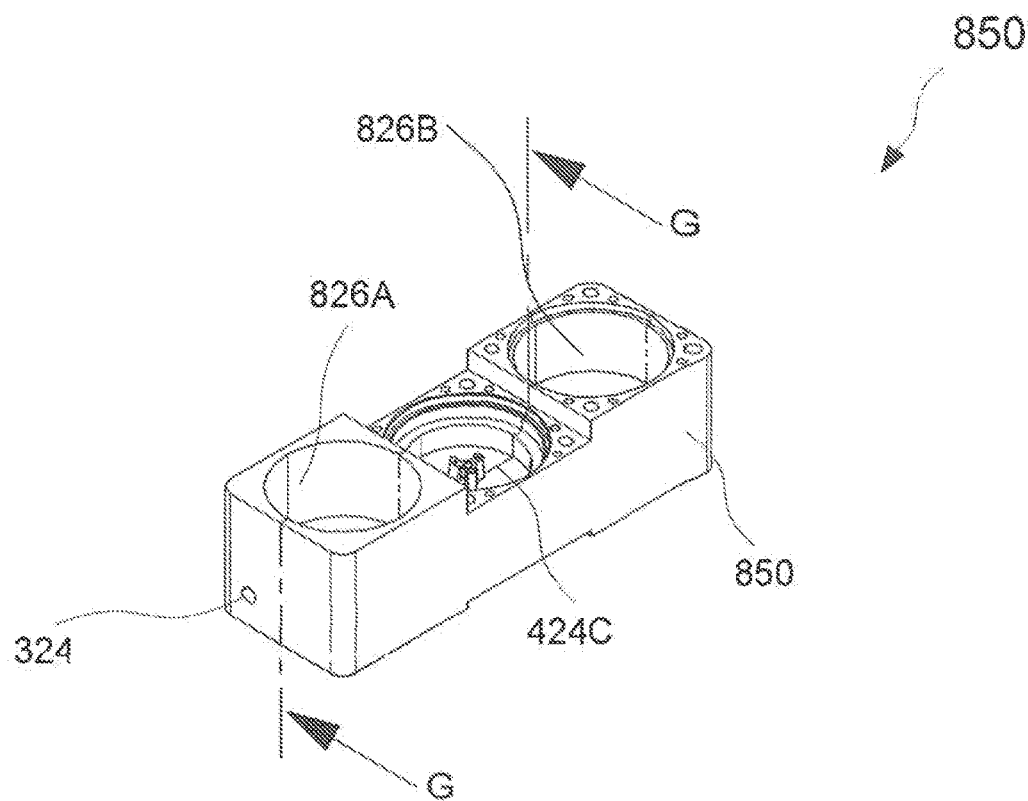
FIG. 12A is schematic perspective first view of the main body of the alternative liquid cooling multi-pumping unit of FIG. 8A with line G-G, according to an exemplary embodiment.
Figure 12B:
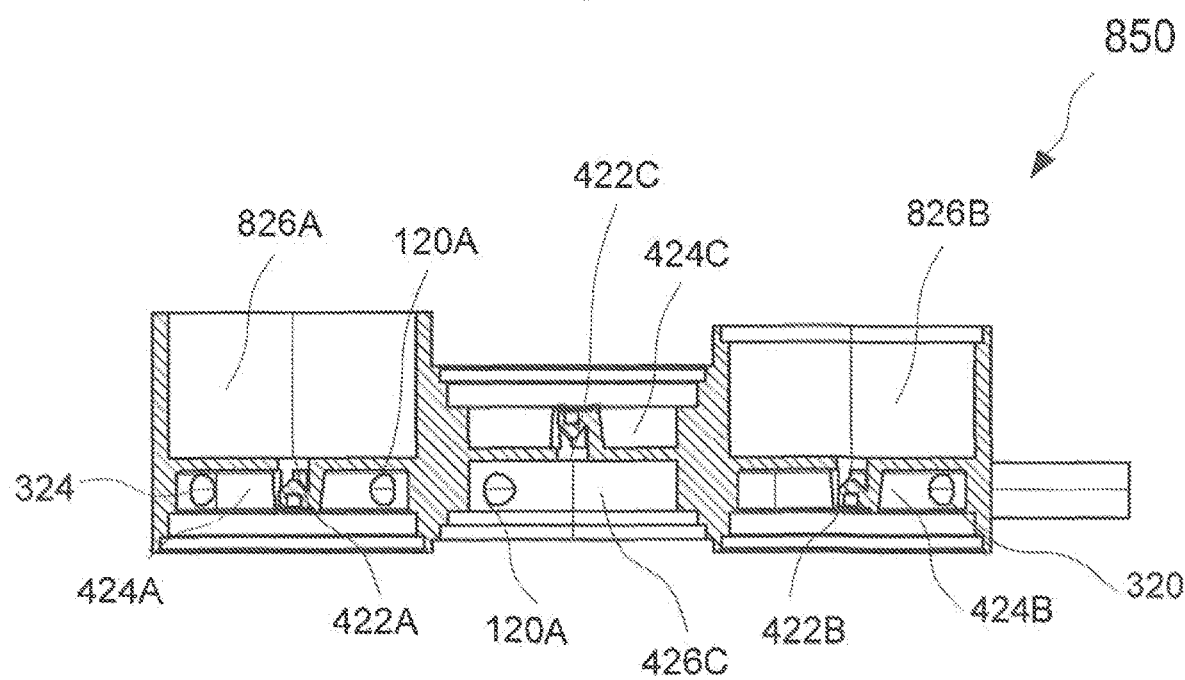
FIG. 12B is schematic cross-sectional view of the main body along line G-G of FIG. 12A, according to an exemplary embodiment.
Figure 13A:
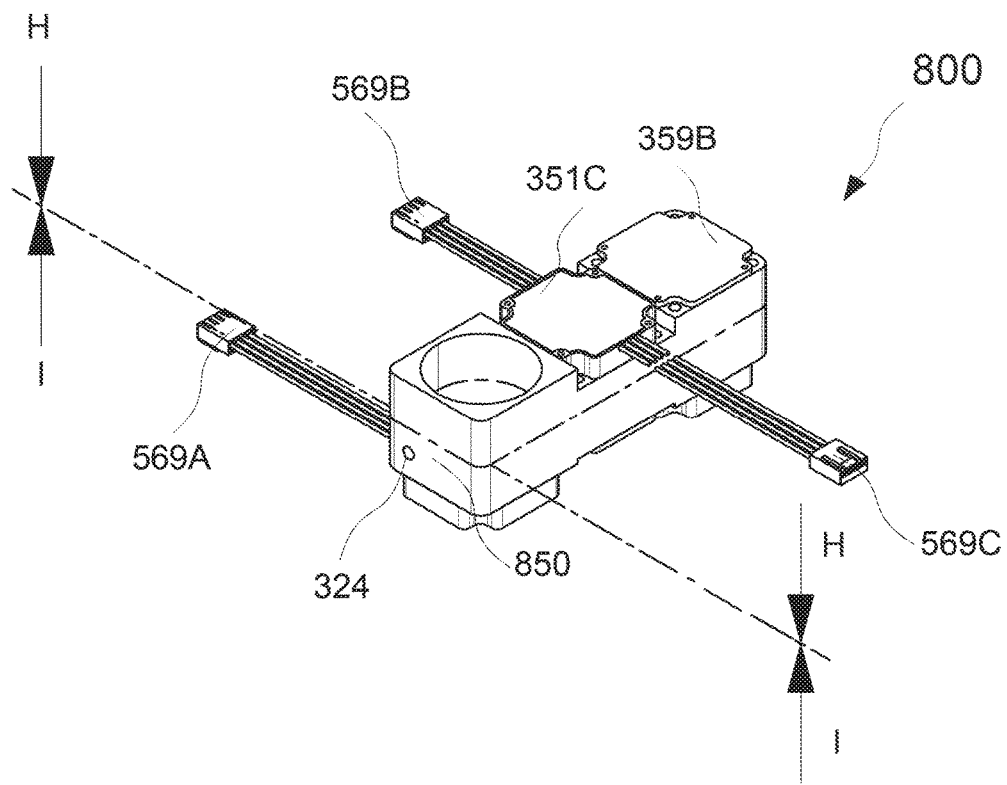
FIG. 13A is schematic perspective first view of the alternative liquid cooling multi-pumping unit of FIG. 8A with line H-H and line I-I, according to an exemplary embodiment.
Figures 13B, 13C:
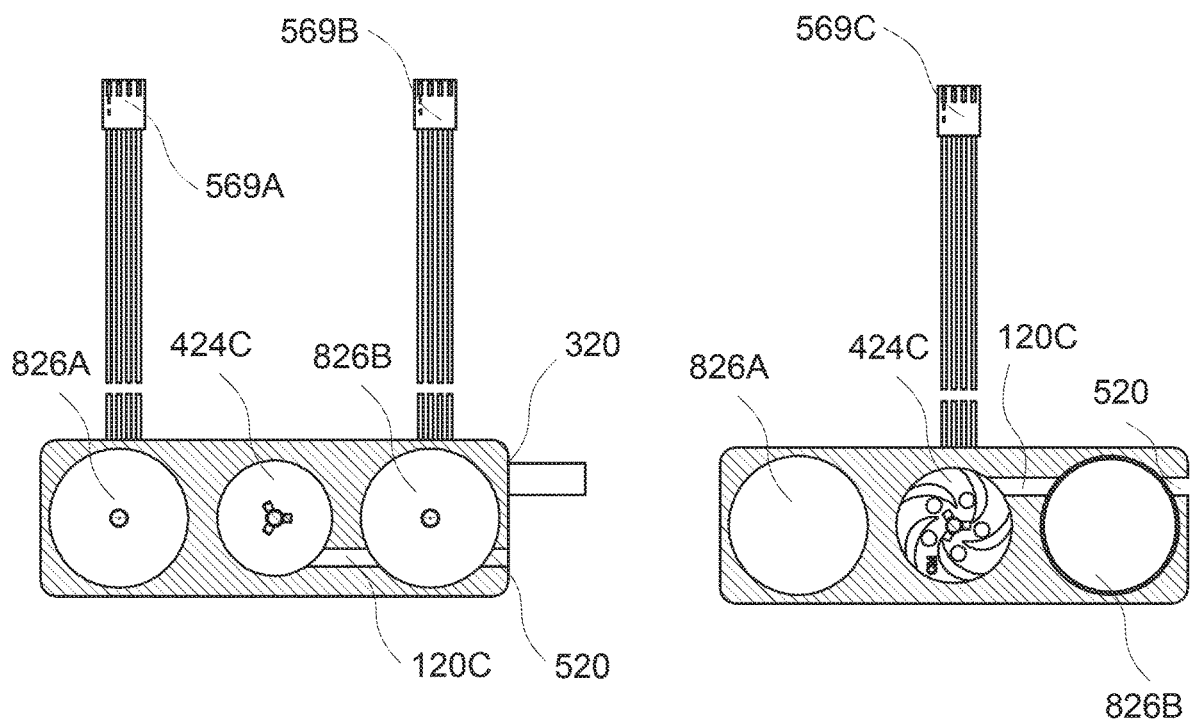
FIG. 13B is schematic cross-sectional view of the alternative liquid cooling multi-pumping unit of FIG. 8A along line H-H of FIG. 13A, according to an exemplary embodiment.
FIG. 13C is schematic cross-sectional view of the alternative liquid cooling multi-pumping unit of FIG. 8A along line I-I of FIG. 13A, according to an exemplary embodiment.
Figure 14A:
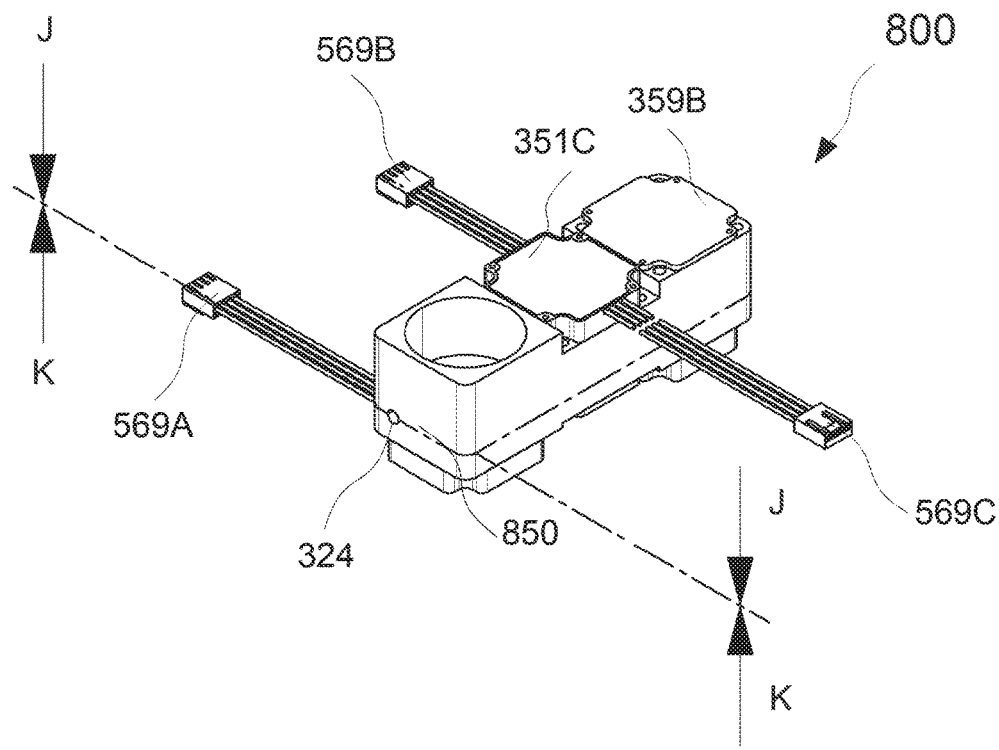
FIG. 14A is schematic perspective first view of the alternative liquid cooling multi-pumping unit of FIG. 8A with line J-J and line K-K, according to an exemplary embodiment.
Figure 14B:
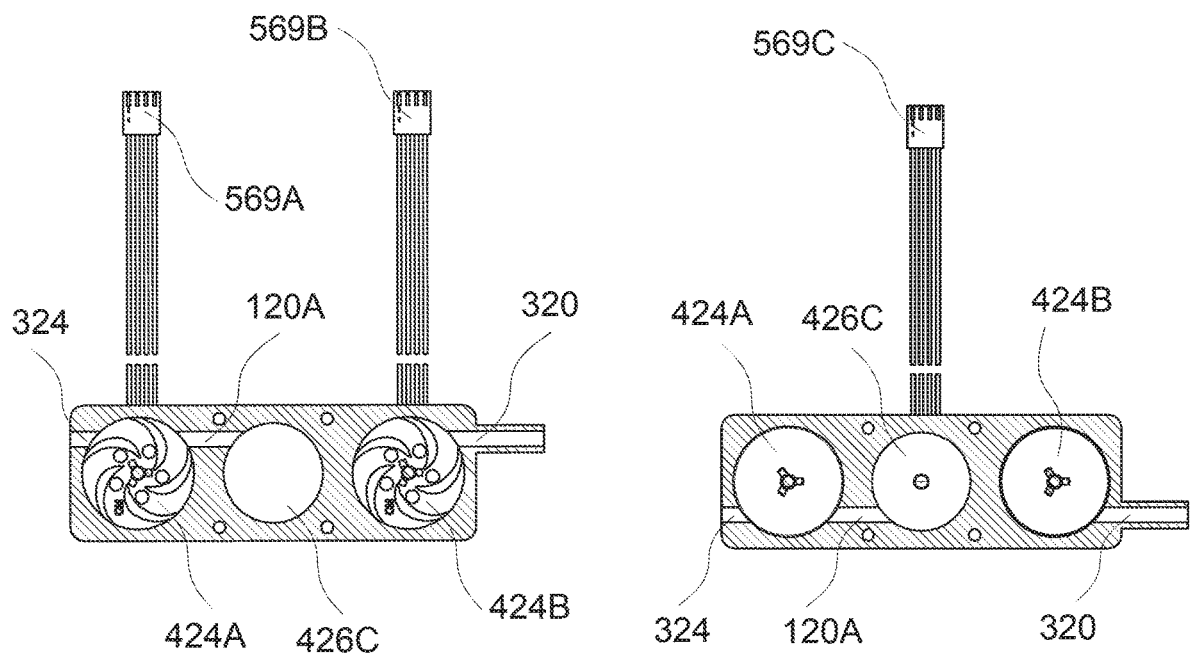
FIG. 14B is schematic cross-sectional view of the alternative liquid cooling multi-pumping unit of FIG. 8A along line J-J of FIG. 14A, according to an exemplary embodiment.
Figure 14C:
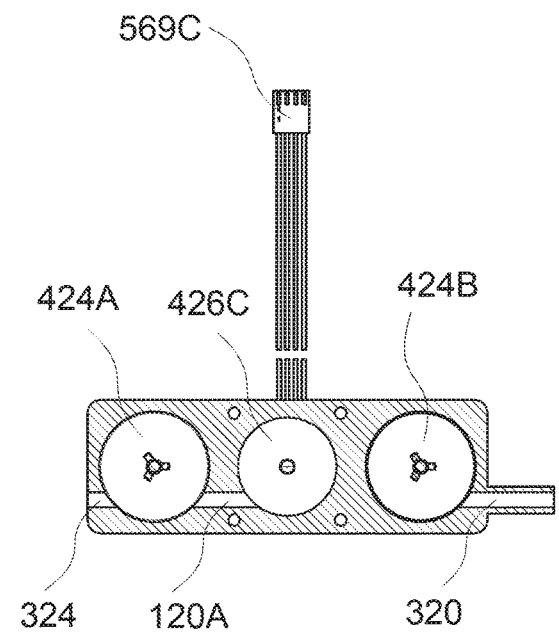
FIG. 14C is schematic cross-sectional view of the alternative liquid cooling multi-pumping unit of FIG. 8A along line K-K of FIG. 14A, according to an exemplary embodiment.
Figure 15:
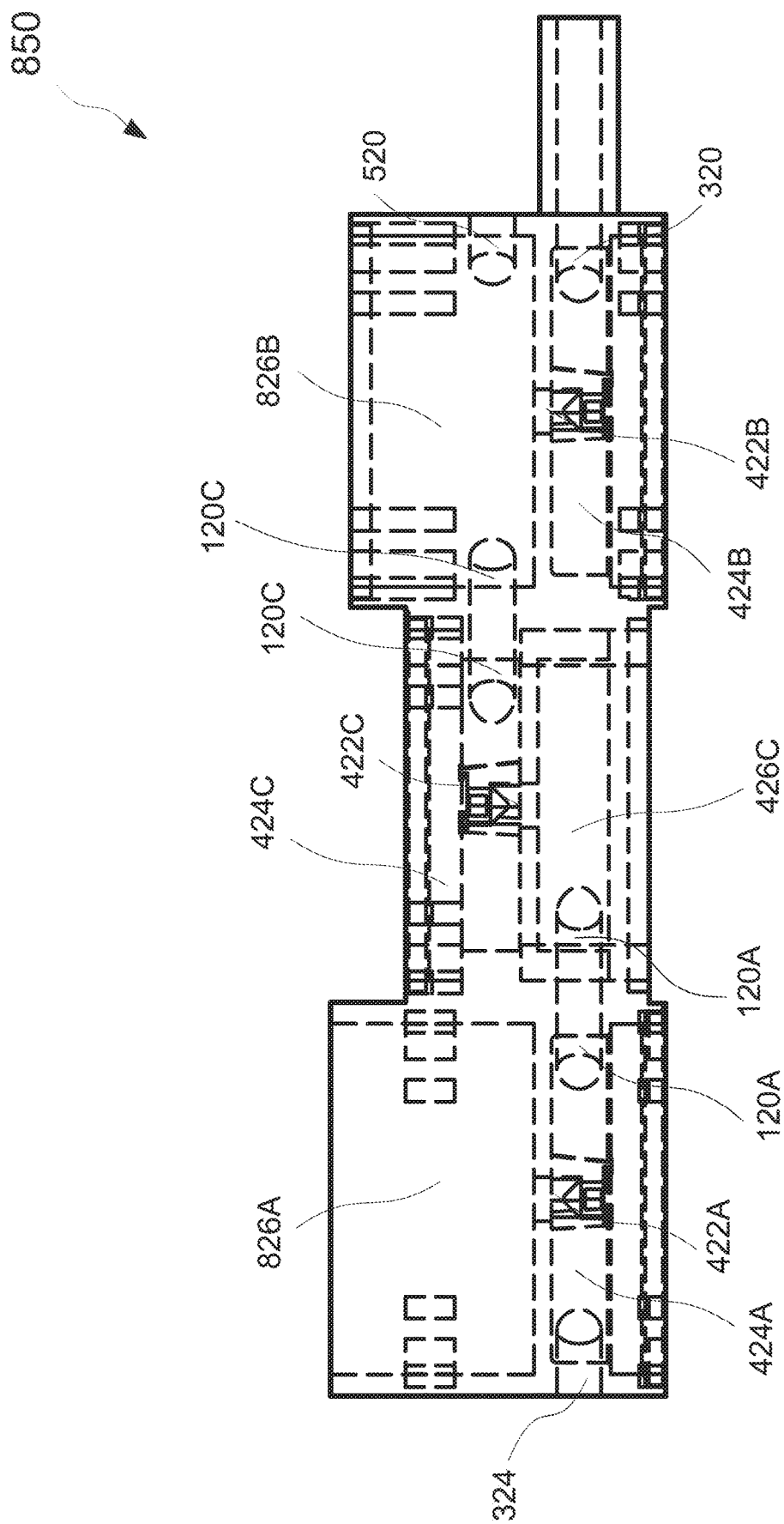
FIG. 15 is a schematic perspective third interior view of the main body of the alternative liquid cooling multi-pumping unit of FIG. 8A, according to an exemplary embodiment.

FIG. 10A is a schematic exploded view of the alternative liquid cooling multi-pumping unit of FIG. 9 with line E-E, according to an exemplary embodiment. FIG. 10B is a schematic cross-sectional view of the alternative liquid cooling multi-pumping unit along line E-E of FIG. 10A, according to an exemplary embodiment. FIG. 11A is schematic perspective first view of the main body of the alternative liquid cooling multi-pumping unit of FIG. 8A with line F-F, according to an exemplary embodiment. FIG. 11B is schematic cross-sectional view of the main body along line F-F of FIG. 11A, according to an exemplary embodiment. FIG. 12A is schematic perspective first view of the main body of the alternative liquid cooling multi-pumping unit of FIG. 8A with line G-G, according to an exemplary embodiment. FIG. 12B is schematic cross-sectional view of the main body along line G-G of FIG. 12A, according to an exemplary embodiment. FIG. 13A is schematic perspective first view of the alternative liquid cooling multi-pumping unit of FIG. 8A with line H-H and line I-I, according to an exemplary embodiment. FIG. 13B is schematic cross-sectional view of the alternative liquid cooling multi-pumping unit of FIG. 8A along line H-H of FIG. 13A, according to an exemplary embodiment. FIG. 13C is schematic cross-sectional view of the alternative liquid cooling multi-pumping unit of FIG. 8A along line I-I of FIG. 13A, according to an exemplary embodiment. FIG. 14A is schematic perspective first view of the alternative liquid cooling multi-pumping unit of FIG. 8A with line J-J and line K-K, according to an exemplary embodiment. FIG. 14B is schematic cross-sectional view of the alternative liquid cooling multi-pumping unit of FIG. 8A along line J-J of FIG. 14A, according to an exemplary embodiment. FIG. 14C is schematic cross-sectional view of the alternative liquid cooling multi-pumping unit of FIG. 8A along line K-K of FIG. 14A, according to an exemplary embodiment. FIG. 15 is a schematic perspective third interior view of the main body of the alternative liquid cooling multi-pumping unit of FIG. 8A, according to an exemplary embodiment. Referring to FIGS. 10A to 15, and referring to FIGS. 8A to 9, the main body 850 of the liquid cooling multi-pumping unit 800 further comprises a first fluid distribution channel 120A, a second fluid distribution channel 120C, and a fluid outlet 320.

In some embodiments, a fluid tank may be added to the liquid cooling multi-pumping unit 800, whereby cooling fluid may be stored. The fluid tank (not shown) is sealingly assembled to the first fluid chamber 826A and positioned thereupon. The fluid tank feeds directly into the liquid cooling multi-pumping unit 800 for even greater flow, ensuring lubrication and heat transfer and avoiding damage and failure thereof. A volume of cooling fluid may be retained in the fluid tank during operation of the liquid cooling system. In some embodiments, a visible portion of the cooling fluid in the fluid tank via a transparent material may allow users to visually observe an amount of cooling fluid in the cooling loop, and determine when additional cooling fluid may need to be added. Via the fluid tank, fluid loss over time due to permeation may be mitigated, and air bubbles may gradually be replaced during fluid circulation, increasing cooling loop efficiency of the liquid cooling system.

The fluid tank (not shown) is in communication with the first fluid chamber 826A and positioned thereupon, the fluid outlet 320 is in communication with the second pump chamber 424B and positioned on a fifth side of the main body 850, opposite the fourth side, the first fluid distribution channel 120A is positioned between the first pump chamber 424A and third fluid chamber 426C, and the second fluid distribution channel 120C is positioned between the third pump chamber 424C and second fluid chamber 826B. In some embodiments, the amount of the first and second fluid distribution channels 120A, 120B, is one each, and the first and second fluid distribution channels 120A, 120B are generally straight and positioned on a plane that is parallel to the first pump chamber 424A and third fluid chamber 426C and third pump chamber 424C and second fluid chamber 826B, respectively; however, the embodiments are not limited thereto.

In some embodiments, the liquid cooling multi-pumping unit 800 further comprises a secondary opening 520. The secondary opening 520 is in communication with the first pump chamber 424A and positioned on a fourth side of the main body 150. Those of ordinary skill in the relevant art may readily appreciate that the secondary opening 520 provides an additional feature for fluid distribution of the first pump chamber 424A, and may be incorporated in various other embodiments of liquid cooling pumping units to achieve any of a variety of desired outcomes, characteristics, and/or performance criteria.

During operation of the liquid cooling multi-pumping unit 800, the first, third and second motor assemblies 569A, 569C, 569B of the first, third and second pumps 260A, 260C, 260B, respectively, rotate the first, third and second impellers 564A, 564C, 564B in series. Cooling fluid is sucked from the first fluid chamber 826A, sealingly assembled to the fluid tank, and then into the first central chamber opening 422A to the plurality of curved blades of the first impeller 564A assembled in the first pump chamber 424A. From there, the cooling fluid travels and is sucked through the first fluid distribution channel 120A into the third fluid chamber 426C and then into the third central chamber opening 422C to the plurality of curved blades of the third impeller 564C assembled in the third pump chamber 424C. Next, the cooling fluid travels and is sucked through the second fluid distribution channel 120B into the second fluid chamber 826B and then into the second central chamber opening 422B to the plurality of curved blades of the second impeller 564B assembled in the second pump chamber 424B, before exiting outward through the fluid outlet 320. The first, third and second fluid chambers 826A, 426C, 826B communicate directly with the first, third and second pump chambers 424A, 424C, 424B, respectively, ensuring lubrication of the liquid cooling multi-pumping unit 800 and heat transfer, avoiding damage and failure thereof.

In some embodiments, the main body of the liquid cooling multi-pumping unit further comprises a fluid inlet (not shown) and a first pump cover (not shown), and not a fluid tank. The fluid inlet is in communication with a first fluid chamber (not shown) and positioned on a fourth side of the main body (not shown), diagonal to the secondary opening 520. The first pump cover is sealingly assembled to the first fluid chamber. During operation of the liquid cooling multi-pumping unit, the first, third and second motor assemblies 569A, 569C, 569B of the first, third and second pumps 260A, 260C, 260B, respectively, rotate the first, third and second impellers 564A, 564C, 564B. Cooling fluid is sucked via the cooling fluid inlet into the first fluid chamber and then into the first central chamber opening 422A to the plurality of curved blades of the first impeller 564A assembled in the first pump chamber 424A. From there, the cooling fluid travels and is sucked through the first fluid distribution channel 120A into the third fluid chamber 426C and then into the third central chamber opening 422C to the plurality of curved blades of the third impeller 564C assembled in the third pump chamber 424C. Next, the cooling fluid travels and is sucked through the second fluid distribution channel 120B into the second fluid chamber 826B and then into the second central chamber opening 422B to the plurality of curved blades of the second impeller 564B assembled in the second pump chamber 424B, before exiting outward through the fluid outlet 320. The first, third and second fluid chambers (not shown), 826A, 426C, 826B communicate directly with the first, third and second pump chambers 424A, 424C, 424B, respectively, ensuring lubrication of the liquid cooling multi-pumping unit 800 and heat transfer, avoiding damage and failure thereof.

In some embodiments, the liquid cooling system is configured to cool each heat generating device included within a chassis or electric or electronics system. In alternative embodiments, the liquid cooling system is configured to cool only selective heat generating devices, or only a single heat generating device, while other heat generating devices are left to be cooled by other or complimentary means.

The cooling fluid of the liquid cooling system may be any type of cooling fluid such as water, water with additives such as anti-fungicide, water with additives for improving heat conducting or other special compositions of cooling fluids such as electrically non-conductive liquids or liquids with lubricant additives or anti-corrosive additives.

Control of the liquid cooling multi-pumping units, driven by an AC or DC electrical motor, preferably takes place by means of an operative system or like means or the electric and/or electronics system itself, wherein the electric and/or electronics system comprises a means for measuring load and/or temperature of one or more processors. Using the measurement performed by the operative system or a like system eliminates the need for special means for operating the liquid cooling multi-pumping units. Communication between the operative system or a like system and a processor for operating the liquid cooling multi-pumping units may take place along already established communication links in the system such as a USB-link. Thereby, a real-time communication between the liquid cooling system and liquid cooling multi-pumping units may be provided without any special means for establishing the communication.

Further control strategies utilizing the operative system or a like system may involve balancing the rotational speed of each of the liquid cooling multi-pumping units as a function of the cooling capacity needed. If a lower cooling capacity is needed, the rotational speed of each of the liquid cooling multi-pumping units may be individually adjusted or limited, thereby limiting the noise generated by the motor driving the liquid cooling multi-pumping units and wear and tear thereof.

In the embodiments, liquid cooling systems and liquid cooling multi-pumping units, wherein a heat exchanger is in thermal contact with electric and/or electronic elements, devices and/or systems, transporting heat away therefrom, and then cooling fluid, circulating inside of a cooling loop system incorporating the heat exchanger via fluid conduits, flows over the heat exchanger by a multi-pumping unit, removing heat therefrom.

In the embodiments, a liquid cooling multi-pumping unit 100 comprises a main body 150 and first and second pumps 260A, 260B. During operation of the liquid cooling multi-pumping unit 100, first and second motor assemblies 569A, 569B of the first and second pumps 260A, 260B, respectively, rotate first and second impellers 564A, 564B. Cooling fluid is sucked via a cooling fluid inlet 420 into a first fluid chamber 426A and then into a first central chamber opening 422A to the plurality of curved blades of the first impeller 564A assembled in the first pump chamber 424A. From there, the cooling fluid travels and is sucked through a fluid distribution channel 120 into a second fluid chamber 426B and then into a second central chamber opening 422B to a plurality of curved blades of the second impeller 564B, before exiting outward through a fluid outlet 320. The first and second fluid chambers 426A, 426B communicate directly with the first and second pump chambers 424A, 424B, respectively, ensuring lubrication of the liquid cooling multi-pumping unit 100 and heat transfer, avoiding damage and failure thereof. Also, air bubbles are decreased as they are gradually replaced during fluid circulation, leading to greater efficiency of the liquid cooling system. The series arrangement of the plurality of pumps assembled in one main body 150, increases head pressure, overcoming long conduit lengths with high friction losses, and provides sufficient liquid flow in the case where one of the plurality of pumps fails, mitigating damage to the electric and/or electronic elements, devices and/or systems due to overheating, while minimizing costs, total installation time, risks for leakage, loss of parts, and total area requirements when compared to separate pump assemblies. Additionally, lower energy consumption is achieved due to the lower operating speeds required, thereby reducing wear and tear, increasing reliability and operating lifespan.

The presently disclosed inventive concepts are not intended to be limited to the embodiments shown herein, but are to be accorded their full scope consistent with the principles underlying the disclosed concepts herein. Directions and references to an element, such as "up," "down,", "upper," "lower," "horizontal," "vertical," "left," "right,"

and the like, do not imply absolute relationships, positions, and/or orientations. Terms of an element, such as "first" and "second" are not literal, but, distinguishing terms. As used herein, terms "comprises" or "comprising" encompass the notions of "including" and "having" and specify the presence of elements, operations, and/or groups or combinations thereof and do not imply preclusion of the presence or addition of one or more other elements, operations and/or groups or combinations thereof. Sequence of operations do not imply absoluteness unless specifically so stated. Reference to an element in the singular, such as by use of the article "a" or "an", is not intended to mean "one and only one" unless specifically so stated, but rather "one or more". As used herein, "and/or" means "and" or "or", as well as "and" and "or." As used herein, ranges and subranges mean all ranges including whole and/or fractional values therein and language which defines or modifies ranges and subranges, such as "at least," "greater than," "less than," "no more than," and the like, mean subranges and/or an upper or lower limit. All structural and functional equivalents to the elements of the various embodiments described throughout the disclosure that are known or later come to be known to those of ordinary skill in the relevant art are intended to be encompassed by the features described and claimed herein. Moreover, nothing disclosed herein is intended to be dedicated to the public regardless of whether such disclosure may ultimately explicitly be recited in the claims. No element or concept disclosed herein or hereafter presented shall be construed under the provisions of 35 USC 112f unless the element or concept is expressly recited using the phrase "means for" or "step for".

In view of the many possible embodiments to which the disclosed principles can be applied, we reserve the right to claim any and all combinations of features and acts described herein, including the right to claim all that comes within the scope and spirit of the foregoing description, as well as the combinations recited, literally and equivalently, in the following claims and any claims presented anytime throughout prosecution of this application or any application claiming benefit of or priority from this application.

What is claims is:

1. A liquid cooling multi-pumping unit, comprising:
   first and second pumps arranged in series;
   the first pump comprising a cooling fluid inlet connected to a first fluid chamber, the first fluid chamber in fluid connection with a first central chamber opening leading to a first pump chamber housing a first pump mechanism, the first pump chamber comprising a first distribution channel in fluid communication with a second fluid chamber of the second pump;
   wherein the second pump further comprises a second central chamber opening leading to a second pump chamber housing a second pump mechanism, the second pump chamber comprising a fluid outlet; and
   wherein the first pump chamber is substantially coplanar with the second fluid chamber.

2. The liquid cooling multi-pumping unit of claim 1, wherein the first and second pump mechanisms comprise impellers, each with a plurality of curved blades.

3. The liquid cooling multi-pumping unit of claim 1, wherein the first pump comprises a first motor assembly that drives the first pump mechanism, and the second pump comprises a second motor assembly that drives the second pump mechanism.

4. The liquid cooling multi-pumping unit of claim 1, wherein the first pump further comprises a first stator case connected to a first motor assembly, the first stator case housing a first stator and a first impeller having a plurality of curved blades, and the second pump further comprises a second stator case connected to a second motor assembly, the second stator case housing a second stator and a second impeller having a plurality of curved blades, and wherein a side of the first impeller opposite the plurality of curved blades corresponds in dimensions and depth to a side of the first stator casing opposite the first motor assembly.

5. The liquid cooling multi-pumping unit of claim 1, wherein the first and second pumps are formed in a main body.

6. The liquid cooling multi-pumping unit of claim 1, wherein the first pump further comprises a first pump cover and a first pump plate, and the second pump further comprises a second pump cover and a second pump plate.

7. The liquid cooling multi-pumping unit of claim 5, wherein the first and second pumps are sealingly assembled to the main body.

8. The liquid cooling multi-pumping unit of claim 6, wherein the first and second pump covers are sealingly assembled to the first and second fluid chambers, respectively.

9. The liquid cooling multi-pumping unit of claim 1, further comprising a third pump arranged in series with the second pump.

10. The liquid cooling multi-pumping unit of claim 2, wherein the impellers comprise curved blades for clock-wise rotation.

11. The liquid cooling multi-pumping unit of claim 5, wherein the main body is formed of metal.

12. The liquid cooling multi-pumping unit of claim 1, wherein at least one of the first pump and the second pump are in contact with a heat generating electronic device.

13. A liquid cooling multi-pumping unit, comprising:
    first, second and third pumps arranged in series;
    the first pump comprising a cooling fluid inlet connected to a first fluid chamber, the first fluid chamber in fluid connection with a first central chamber opening leading to a first pump chamber housing a first pump mechanism, the first pump chamber comprising a first distribution channel in fluid communication with a third fluid chamber of the third pump;
    wherein the third pump further comprises a third central chamber opening leading to a third pump chamber housing a third pump mechanism, the third pump chamber comprising a second fluid distribution channel in fluid communication with the second pump;
    wherein the second pump further comprises a second central chamber opening leading to a second pump chamber housing a second pump mechanism, the second pump chamber comprising a fluid outlet;
    and wherein the first pump chamber is substantially coplanar with the third fluid chamber and the second pump chamber.

14. The liquid cooling multi-pumping unit of claim 13, wherein the first, second and third pump mechanisms comprise impellers, each with a plurality of curved blades.

15. The liquid cooling multi-pumping unit of claim 13, wherein the first pump comprises a first motor assembly that drives the first pump mechanism, the third pump comprises a third motor assembly that drives the third pump mechanism, and the second pump comprises a second motor assembly that drives the second pump mechanism.

16. The liquid cooling multi-pumping unit of claim 13, wherein the first fluid chamber is arranged above the first pump chamber, the second fluid chamber is arranged above the second pump chamber, and the third fluid chamber is arranged below the third pump chamber.

17. The liquid cooling multi-pumping unit of claim 13, wherein the first pump further comprises a first stator case connected to a first motor assembly, the first stator case housing a first stator and a first impeller having a plurality of curved blades, the third pump further comprises a third stator case connected to a third motor assembly, the third stator case housing a third stator and a third impeller having a plurality of curved blades, and the second pump further comprises a second stator case connected to a second motor assembly, the second stator case housing a second stator and a second impeller having a plurality of curved blades, and wherein a side of the first impeller opposite the plurality of curved blades corresponds in dimensions and depth to a side of the first stator casing opposite the first motor assembly.

18. The liquid cooling multi-pumping unit of claim 13, wherein the first, second and third pumps are formed in a main body.

19. The liquid cooling multi-pumping unit of claim 13, wherein the first pump further comprises a first pump cover and a first pump plate, the third pump further comprises a third pump cover and a third pump plate, and the second pump further comprises a second pump cover and a second pump plate.

20. The liquid cooling multi-pumping unit of claim 18, wherein the first, second and third pumps are sealingly assembled to the main body.

21. The liquid cooling multi-pumping unit of claim 19, wherein the first, second and third pump covers are sealingly assembled to the first, second and third fluid chambers, respectively.

22. The liquid cooling multi-pumping unit of claim 14, wherein the impellers comprise curved blades for clock-wise rotation.

23. The liquid cooling multi-pumping unit of claim 18, wherein the main body is formed of metal.

24. The liquid cooling multi-pumping unit of claim 13, wherein at least one of the first pump, the second pump and the third pump are in contact with a heat generating electronic device.

* * * * *